United States Patent
Chen et al.

(10) Patent No.: US 12,490,537 B2
(45) Date of Patent: Dec. 2, 2025

(54) IMAGE SENSOR HAVING AN IMPROVED STRUCTURE FOR SMALL PIXEL DESIGNS

(71) Applicant: Taiwan Semiconductor Manufacturing Company, Ltd., Hsinchu (TW)

(72) Inventors: Yen-Yu Chen, Kaohsiung (TW); Yen-Ting Chiang, Tainan (TW); Bai-Tao Huang, Hsinchu (TW); Tse-Hua Lu, Zhubei (TW); Tzu-Hsuan Hsu, Kaohsiung (TW); Shyh-Fann Ting, Tainan (TW); Jen-Cheng Liu, Hsin-Chu (TW); Dun-Nian Yaung, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 636 days.

(21) Appl. No.: 17/832,905

(22) Filed: Jun. 6, 2022

(65) Prior Publication Data
US 2023/0307479 A1 Sep. 28, 2023

Related U.S. Application Data

(60) Provisional application No. 63/322,454, filed on Mar. 22, 2022.

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/18* (2025.01); *H10F 39/802* (2025.01); *H10F 39/811* (2025.01)

(58) Field of Classification Search
CPC ...... H10F 39/014; H10F 39/18; H10F 39/802; H10F 39/807; H10F 39/811; H10F 39/8037; H10F 39/199; H10F 30/28
(Continued)

(56) References Cited

U.S. PATENT DOCUMENTS

| 2014/0054662 A1 | 2/2014 | Yanagita et al. |
| 2018/0061875 A1 | 3/2018 | Roy |

(Continued)

FOREIGN PATENT DOCUMENTS

| KR | 20160017623 A | 2/2016 |
| TW | 202101752 A | 1/2021 |

*Primary Examiner* — Didarul A Mazumder
(74) *Attorney, Agent, or Firm* — Eschweiler & Potashnik, LLC

(57) ABSTRACT

Various embodiments of the present disclosure are directed towards an image sensor. The image sensor includes a substrate having a first side and a second side. The substrate includes a pixel region. A photodetector is in the pixel region. A first doped region is in the pixel region. A second doped region is in the pixel region. The second doped region is vertically between the first doped region and the first side of the substrate. A doped well is in the substrate and laterally surrounds the pixel region. The doped well is partially in the second doped region. A portion of the second doped region is vertically between the doped well and the second side of the substrate. A trench isolation structure is in the semiconductor substrate and laterally surrounds the pixel region. A footprint of the trench isolation structure is within a footprint of the doped well.

20 Claims, 28 Drawing Sheets

(58) Field of Classification Search
USPC .......................................... 257/303; 438/244
See application file for complete search history.

(56) References Cited

U.S. PATENT DOCUMENTS

| | | | |
|---|---|---|---|
| 2019/0096929 A1* | 3/2019 | Chiang | ................ H10F 39/199 |
| 2019/0252425 A1* | 8/2019 | Ogawa | ................ H10F 39/811 |
| 2020/0335535 A1 | 10/2020 | Suzuki | |
| 2021/0091127 A1* | 3/2021 | Tsao | ................... H10F 39/8053 |
| 2021/0098519 A1 | 4/2021 | Hsu et al. | |
| 2021/0143191 A1* | 5/2021 | Ha | ....................... H10F 39/199 |
| 2021/0183920 A1 | 6/2021 | Lee et al. | |
| 2021/0399039 A1 | 12/2021 | Matsumoto | |
| 2022/0020790 A1 | 1/2022 | Zang et al. | |

* cited by examiner

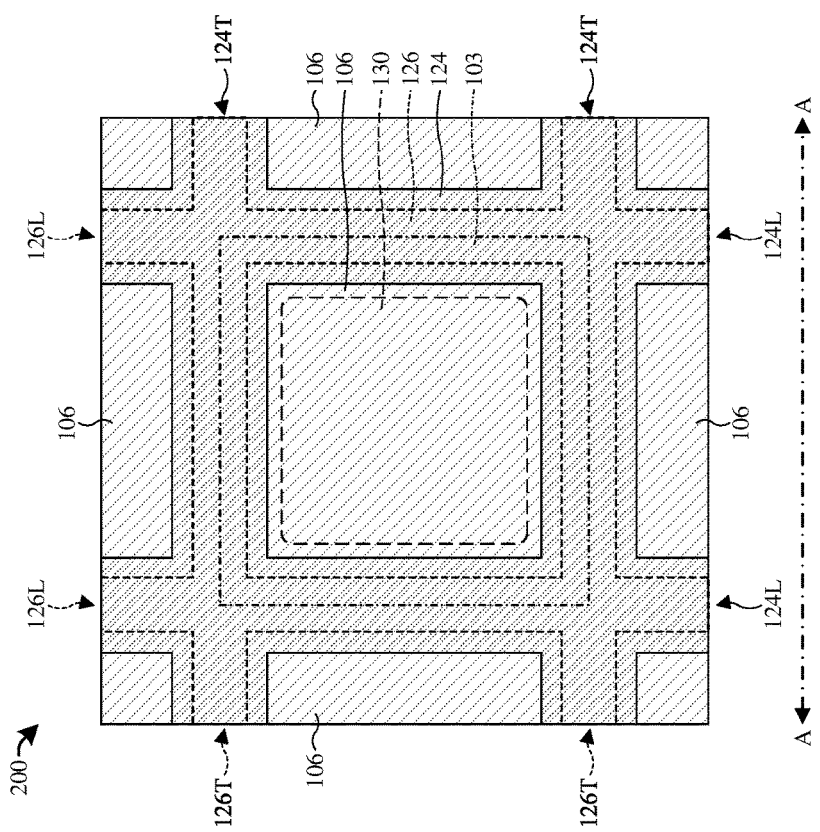
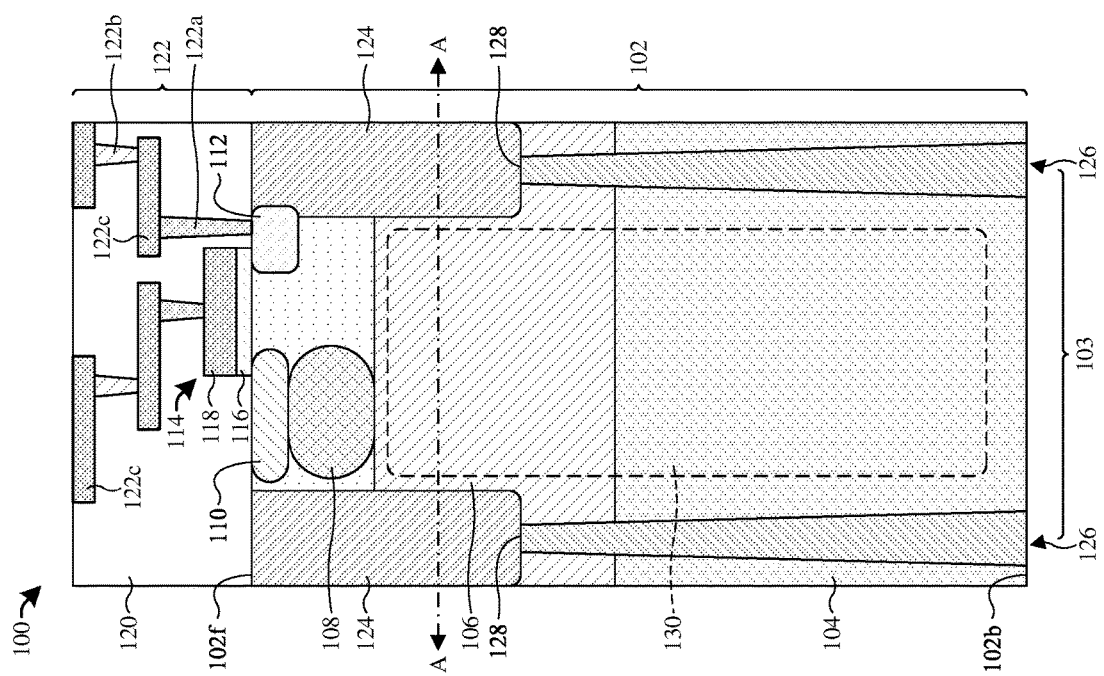
Fig. 2
Fig. 1

IMAGE SENSOR HAVING AN IMPROVED STRUCTURE FOR SMALL PIXEL DESIGNS

REFERENCE TO RELATED APPLICATION

This application claims the benefit of U.S. Provisional Application No. 63/322,454, filed on Mar. 22, 2022, the contents of which are incorporated herein by reference in their entirety.

BACKGROUND

Many modern day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional view of some embodiments of an image sensor having an improved structure for small pixel designs.

FIG. 2 illustrates a cross-sectional view of some embodiments of the image senor of FIG. 1.

DETAILED DESCRIPTION

Figure 3:
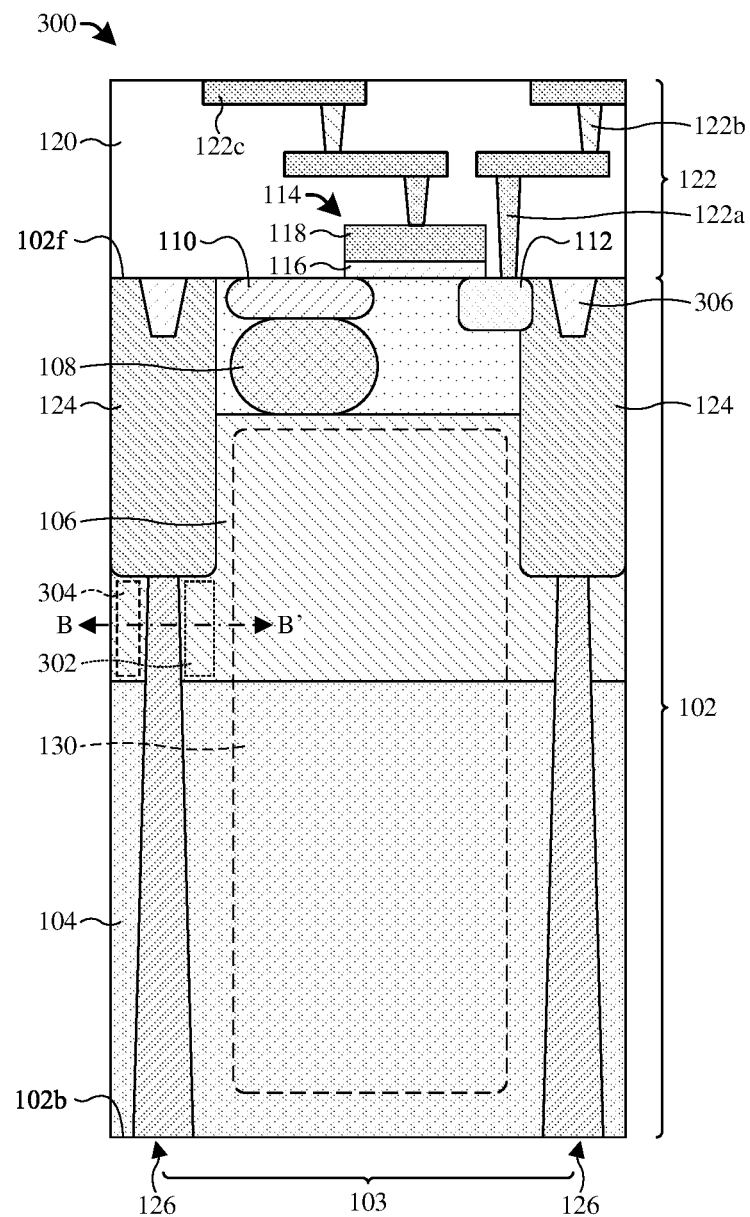
FIG. 3 illustrates a cross-sectional view of some embodiments of the image senor of FIG. 1.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, etc.) include an image sensor for capturing images. One example of such an image sensor is a complementary metal-oxide-semiconductor (CMOS) image sensor (CIS) having an array of photodetectors. Each of the photodetectors are disposed in a pixel region of a substrate (e.g., semiconductor substrate). Each of the pixel regions comprise a doped portion of the substrate. The doped portion of the substrate is a portion of the substrate having a first doping type (e.g., n-type).

A back-side deep trench isolation (BDTI) structure is disposed in the substrate and laterally surrounds the pixel regions. Typically, a deep well region is disposed in the substrate. The deep well region is a deeply doped region of the substrate having a second doping type opposite the first doping type (e.g., p-type). The deep well region extends vertically from a front side of the substrate to (or very near to) the back side of the substrate. The BDTI structure is disposed in the deep well region, and the deep well region laterally surrounds the entirety of the BDTI structure.

Typically, the doped portions of the substrate and the deep well region are formed via lithography processes. For example, the doped portions of the substrate are formed via a first lithography process, and the deep well region is formed via a second lithography process. The first lithography process requires a first masking layer (e.g., a positive/negative photoresist), and the second lithography process requires a second masking layer (e.g., a positive/negative photoresist) that is different than the first masking layer. Because the doped portions of the substrate are formed via the first lithography process and because the deep well region is formed via the second lithography process, the doped portions of the substrate may be laterally spaced from the deep well regions by a non-zero distance (e.g., due to poor overlay control). Thus, the ability to scale down dimensions (e.g., footprint size) of the pixel regions of the image sensor may be limited. Accordingly, the typical process for forming an image sensor may limit the ability to scale down the dimensions of CISs (e.g., limit the development of extremely small pixel pitch CISs).

Further, due to the depth of the deep well region, the second masking layer must be relatively tall (e.g., the second masking layer needs to be tall to prevent ions from being unintentionally implanted in masked portion of the substrate). Because the second masking layer needs to be relatively tall, the second masking layer may limit the ability to scale down the dimensions of the deep well region (e.g., it is difficult to control the width of a small trench formed in the second masking layer). Because the second masking layer may limit the ability to scale down the dimensions of the deep well region, the second masking layer may further limit the ability to scale down the dimensions of the pixel regions. Thus, the deep well region may further limit the ability to scale down the dimensions of CISs.

Various embodiments of the present disclosure are related to an image sensor (e.g., CIS). The image sensor includes a semiconductor substrate having a first side opposite a second side. The semiconductor substrate comprises a pixel region. A photodetector is disposed in the pixel region. A first doped region is disposed in the pixel region. A second doped region is disposed in the pixel region. The second doped region is disposed vertically between the first doped region and the first side of the semiconductor substrate. A doped well is disposed in the semiconductor substrate and laterally surrounds the pixel region. The doped well extends partially into the second doped region such that a portion of the second doped region is disposed vertically between the doped well and the second side of the semiconductor substrate. A deep trench isolation (DTI) structure is disposed in the semiconductor substrate and laterally surrounds the pixel region. The DTI structure extends vertically into the semiconductor substrate from the second side of the semiconductor substrate. A footprint of the DTI structure is disposed within a footprint of the doped well.

Because the doped well partially extends into the semiconductor substrate, and because the footprint of the DTI structure is disposed within the footprint of the doped well, a size of the pixel region (e.g., a size of a footprint of the pixel region) may be reduced in comparison to a size of a pixel region of a typical image sensor. More specifically, because the doped well extends partially into the semiconductor substrate (instead of fully into the semiconductor substrate as in the case of a typical image sensor), the dimensions (e.g., thickness) of the doped well may be reduced in comparison to a typical CIS. Therefore, dimensions (e.g., footprint size) of the pixel region may be reduced in comparison to the typical CIS. Accordingly, because the dimensions of the pixel region may be reduced in comparison to the typical CIS, the image sensor of the present disclosure may have more scaled down dimensions than the typical CIS. Further, because the DTI structure is disposed within the footprint of the doped well, the dimensions (e.g., footprint size) of the pixel region may be reduced in comparison to the typical CIS while still having good electrical performance (e.g., good electrical isolation between neighboring photodetectors, good full well capacity, etc.). Accordingly, the image sensor of the present disclosure may have more scaled down dimensions than the typical CIS while still potentially having performance that meets or exceeds the performance of the typical CIS.

Moreover, in some embodiments, the DTI structure contacts the first doped region and the second doped region. The DTI structure may contact the first doped region and the second doped region due to the doped well extending partially into the semiconductor substrate and due to an improved method of forming the image sensor of the present disclosure (e.g., forming the first and second doped regions via blanket doping process(es)), which is described in more detail below. Therefore, the dimensions of the pixel region may be reduced even further in comparison to the typical CIS. Thus, because the dimensions of the pixel region may be reduced even further in comparison to the typical CIS, the image sensor of the present disclosure may have even more scaled down dimensions than the typical CIS.

FIG. 1 illustrates a cross-sectional view 100 of some embodiments of an image sensor having an improved structure for small pixel designs.

As shown in the cross-sectional view 100 of FIG. 1, the image sensor comprises a substrate 102 (e.g., semiconductor substrate). The substrate 102 has a front side 102*f* and a back side 102*b* opposite the front side 102*f*. In some embodiments, the front side 102*f* of the substrate 102 is defined by a first surface (e.g., a front side surface), and the back side 102*b* of the substrate 102 is defined by a second surface (e.g., a back side surface) that is opposite the first surface. The substrate 102 comprises a pixel region 103. The pixel region 103 is a portion of the substrate 102 in which features (e.g., structural features that are described in more detail below) of an individual pixel (e.g., pixel sensor) of the image sensor are disposed. In some embodiments, the substrate 102 comprises a plurality of pixel regions that are disposed in an array, and the pixel region 103 is an individual pixel region of the plurality of pixel regions.

The substrate 102 may comprise any type of semiconductor body (e.g., monocrystalline silicon/CMOS bulk, germanium (Ge), a group III-V semiconductor material, silicon-germanium (SiGe), silicon on insulator (SOI), etc.). In some embodiments, the image sensor (e.g., back-side illumination image sensor) is configured to record incident radiation (e.g., photons) that passes through the back side 102*b* of the substrate 102. In other embodiments, the image sensor (e.g., front-side illumination image sensor) is configured to record incident radiation (e.g., photons) that passes through the front side 102*f* of the substrate 102. The substrate 102 may have a first doping type (e.g., p-type/n-type), or may be intrinsic.

A first doped region 104 is disposed in the substrate 102. The first doped region 104 is also disposed in the pixel region 103. The first doped region 104 is a region of the substrate 102 having a second doping type (e.g., n-type/p-type). The second doping type is opposite the first doping type (e.g., the second doping type is n-type and the first doping type is p-type, or vice versa).

A second doped region 106 is disposed in the substrate 102. The second doped region 106 is also disposed in the pixel region 103. The second doped region 106 is a region of the substrate 102 having the second doping type (e.g., n-type/p-type). In some embodiments, the first doped region 104 has a greater concentration of second doping type dopants (e.g., n-type dopants (such as phosphorus (P), arsenic (As), antimony (Sb), etc.) or p-type dopants (such as boron (B), aluminum (Al), gallium (Ga), etc.)) than the second doped region 106. In other embodiments, the first doped region 104 has a lower concentration of the second doping type dopants than the second doped region 106.

The first doped region 104 is disposed vertically between the back side 102*b* of the substrate 102 and the second doped region 106. In some embodiments, the first doped region 104 extends vertically from the second doped region 106 to the back side 102*b* of the substrate 102. The second doped region 106 extends vertically from the first doped region 104 toward the front side 102*f* of the substrate 102.

The first doped region 104 extends laterally through the substrate 102. In some embodiments, the first doped region 104 extends continuously laterally thorough the substrate 102, such that the first doped region 104 extends continuously laterally between opposite outermost sides of the substrate 102 (e.g., opposite outermost sidewalls of the die). The second doped region extends laterally through the substrate 102. In some embodiments, the second doped region 106 extends continuously laterally thorough the substrate, such that the second doped region 106 extends continuously laterally between opposite outermost sides of the substrate 102 (e.g., opposite outermost sidewalls of the die).

A third doped region 108 is disposed in the substrate 102. The third doped region 108 is also disposed in the pixel region 103. The third doped region 108 is a region of the substrate 102 having the second doping type (e.g., n-type/p-type). The third doped region 108 is disposed vertically between the second doped region 106 and the front side 102*f* of the substrate 102. In some embodiments, the third doped region 108 has a greater concentration of the second doping type dopants than the second doped region 106. In other embodiments, the third doped region 108 has a lower concentration of the second doping type dopants than the second doped region 106.

A fourth doped region 110 is disposed in the substrate 102. The fourth doped region 110 is also disposed in the pixel region 103. The fourth doped region 110 is a region of the substrate 102 having the first doping type (e.g., p-type/n-type). The fourth doped region 110 is disposed vertically between the third doped region 108 and the front side 102*f* of the substrate 102. In some embodiments, the fourth doped region 110 extends vertically from the third doped region 108 to the front side 102*f* of the substrate 102. In some embodiments, the third doped region 108 extends vertically from the second doped region 106 to the fourth doped region 110. In some embodiments, the fourth doped region 110 has a greater concentration of first doping type dopants (e.g., p-type dopants (such as boron (B), aluminum (Al), gallium (Ga), etc.) or n-type dopants (such as phosphorus (P), arsenic (As), antimony (Sb), etc.)) than the substrate 102 (e.g., portions of the substrate 102 that are not labeled as being a specifically doped region of the substrate 102 in FIG. 1).

A floating diffusion node 112 is disposed in the substrate 102. The floating diffusion node 112 may also be disposed, at least partially, in the pixel region 103. The floating diffusion node 112 is a region of the substrate 102 having the second doping type. The floating diffusion node 112 may be laterally spaced from the third doped region 108 and/or the fourth doped region 110. In some embodiments, the floating diffusion node 112 has a greater concentration of the second doping type dopants than the first doped region 104, the second doped region 106, and/or the third doped region 108. In further embodiments, the floating diffusion node 112 may be a common floating diffusion node that is shared by two or more pixel sensor unit.

A transfer gate 114 is disposed over/on the front side 102*f* of the substrate 102. The transfer gate 114 may overlie, at least partially, the pixel region 103. The transfer gate 114 is disposed laterally between the fourth doped region 110 and the floating diffusion node 112. In some embodiments, the transfer gate 114 is disposed laterally between the third doped region 108 and the floating diffusion node 112.

The transfer gate 114 comprises a gate dielectric structure 116 and a gate electrode structure 118. The gate dielectric structure 116 may be disposed over the front side 102*f* of the substrate 102. The gate electrode structure 118 overlies the gate dielectric structure 116. In some embodiments, the gate dielectric structure 116 is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, the gate electrode structure 118 is or comprises, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing.

An interlayer dielectric (ILD) structure 120 is disposed over the front side 102*f* of the substrate 102. The ILD structure 120 is disposed over the transfer gate 114. In some embodiments, the ILD structure 120 comprises one or more stacked ILD layers, which may respectively comprise a low-k dielectric (e.g., a dielectric material with a dielectric constant less than about 3.9), an oxide (e.g., $SiO_2$), or the like. In some embodiments, the ILD structure 120 is referred to as a dielectric structure.

An interconnect structure 122 (e.g., copper interconnect) is disposed in the ILD structure 120 and over the front side 102*f* of the substrate 102. The interconnect structure 122 comprises a plurality of conductive contacts 122*a* (e.g., metal contacts), a plurality of conductive vias 122*b* (e.g., metal vias), and a plurality of conductive wires 122*c* (e.g., metal wires). In some embodiments, the interconnect structure 122 may be or comprise, for example, copper (Cu), aluminum (Al), tungsten (W), gold (Au), some other conductive material, or a combination of the foregoing. In further embodiments, the plurality of conductive contacts 122*a* may comprise a first conductive material (e.g., W), and the plurality of conductive vias 122*b* and the plurality of conductive wires 122*c* may comprise a second conductive material (e.g., Cu) different than the first conductive material.

A doped well 124 is disposed in the substrate 102. The doped well 124 is also disposed, at least partially, in the pixel region 103. The doped well 124 is a portion of the substrate 102 having the first doping type. In some embodiments, the second doped region 106 continuously extends laterally between opposite inner sides of the doped well 124. In further embodiments, the second doped region 106 (directly) contacts both of the opposite inner sides of the doped well 124.

The doped well 124 extends vertically into the substrate 102 from the front side 102*f* of the substrate 102. The doped well 124 may extend partially through the substrate 102 (e.g., not fully through the substrate 102). The doped well 124 extends vertically through the substrate 102 and into the second doped region 106. In some embodiments, the doped well 124 extends vertically partially into the second doped region 106, such that a portion of the second doped region 106 is disposed vertically between the doped well 124 and the first doped region 104.

The doped well 124 extends laterally through the substrate 102 in a closed loop path. In some embodiments, the doped well 124 extends laterally through the substrate 102 in a closed loop path, such that the doped well 124 laterally surrounds the pixel region 103. In some embodiments, the doped well 124 has a ring-shaped layout when viewed from a top view (and/or a layout view). In some embodiments, half of the doped well 124 is disposed in the pixel region 103. For example, in embodiments in which the doped well 124 has the ring-shaped layout, an inner ring-shaped portion of the doped well 124 is disposed in the pixel region 103 and an outer ring-shaped portion of the doped well 124, which laterally surrounds the inner ring-shaped portion of the doped well 124, is disposed outside the pixel region 103 (e.g., in other pixels regions of substrate 102 that neighbor the pixel region 103). In further embodiments, the inner ring-shaped portion of the doped well 124 and the outer ring-shaped portion of the doped well 124 may have a same thickness (e.g., a distance between an inner diameter and outer diameter of a ring-shaped structure). It will be appreciated that more than half or less than half of the doped well 124 may be disposed in the pixel region 103 (e.g., the thickness of the inner ring-shaped portion of the doped well 124 is different (less than or greater than) the outer ring-shaped portion of the doped well 124).

In some embodiments, the doped well 124 has a greater concentration of the first doping type dopants than the substrate 102. In some embodiments, the doped well 124 has a lower concentration of the first doping type dopants than the fourth doped region 110. In other embodiments, the doped well 124 has a greater concentration of the first doping type dopants than the fourth doped region 110. In some embodiments, the doping concentration of the first doping type dopants may be about the same (e.g., "about" the same includes small variations caused by the fabrication process) along the depth of the doped well 124. In other embodiments, the doping concentration of the first doping type dopants may vary along the depth of the doped well 124 (e.g., the doped well 124 may have a gradient doping profile with two or more distinct doping concentrations).

A deep trench isolation (DTI) structure 126 is disposed in the substrate 102. The DTI structure 126 extends vertically into the substrate 102 from the back side 102b of the substrate 102. The DTI structure 126 may extend partially through the substrate 102 (e.g., not fully through the substrate 102). In some embodiments, the second doped region 106 continuously extends laterally between opposite inner sidewalls of the DTI structure 126. In further embodiments, the second doped region 106 (directly) contacts both of the opposite inner sidewalls of the DTI structure 126. In some embodiments, the second doped region 106 continuously extends laterally between the opposite inner sides of the doped well 124 and continuously extends laterally between the opposite inner sidewalls of the DTI structure 126.

The DTI structure 126 extends vertically through the substrate 102 and into the second doped region 106. In some embodiments, the DTI structure 126 extends vertically partially into the second doped region 106, such that a portion of the second doped region 106 is disposed vertically between the DTI structure 126 and the front side 102f of the substrate 102. In other embodiments, the DTI structure 126 may extend vertically through both the first doped region 104 and the second doped region 106, such that some other portion of the substrate 102 that is disposed vertically between the second doped region 106 and the front side 102f of the substrate 102 is disposed vertically between the DTI structure 126 and the front side 102f of the substrate 102. In yet other embodiments, the DTI structure 126 may extend from the back side 102b of the substrate 102 to the front side 102f of the substrate 102 (e.g., extend fully through the substrate 102).

In some embodiments, the DTI structure 126 is referred to as an isolation structure. In some embodiments, the DTI structure 126 may be referred to as back-side deep trench isolation (BDTI) structure. In such embodiments, the DTI structure 126 may extend into the substrate 102 from the back side 102b of the substrate 102. It will be appreciated that, in some embodiments, the DTI structure 126 may extend into the substrate from the front side 102f of the substrate 102, rather than the back side 102b of the substrate 102. In such embodiments, the DTI structure 126 may be referred to as front-side deep trench isolation (FDTI) structure.

In some embodiments, the DTI structure 126 may be or comprise, for example, an oxide (e.g., $SiO_2$), a nitride (e.g., silicon nitride (SiN)), an oxy-nitride (e.g., silicon oxynitride (SiON)), tetraethoxysilane (TEOS), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, the DTI structure 126 may have angled sidewalls, as illustrated in the cross-sectional view 100 of FIG. 1. In other embodiments, the sidewalls of the DTI structure 126 may be substantially straight (e.g., vertical).

The DTI structure 126 extends laterally through the substrate 102 in a closed loop path. In some embodiments, the DTI structure 126 extends laterally through the substrate 102 in a closed loop path, such that the DTI structure 126 laterally surrounds the pixel region 103. In some embodiments, the DTI structure 126 has a ring-shaped layout when viewed from a top view (and/or a layout view). In some embodiments, half of the DTI structure 126 is disposed in the pixel region 103. For example, in embodiments in which the DTI structure 126 has the ring-shaped layout, an inner ring-shaped portion of the DTI structure 126 is disposed in the pixel region 103 and an outer ring-shaped portion of the DTI structure 126, which laterally surrounds the inner ring-shaped portion of the DTI structure 126, is disposed outside the pixel region 103 (e.g., in the other pixels regions of substrate 102 that neighbor the pixel region 103). In further embodiments, the inner ring-shaped portion of the DTI structure 126 and the outer ring-shaped portion of the DTI structure 126 may have a same thickness (e.g., a distance between an inner diameter and outer diameter of a ring-shaped structure). It will be appreciated that more than half or less than half of the DTI structure 126 may be disposed in the pixel region 103 (e.g., the thickness of the inner ring-shaped portion of the DTI structure 126 is different (less than or greater than) the outer ring-shaped portion of the DTI structure 126).

An upper surface 128 of the DTI structure 126 has a footprint that is disposed within a footprint of the doped well 124. A footprint corresponds to an area occupied by a vertical projection of a given feature onto a lateral plane that extends laterally in parallel with the back side 102b of the substrate 102. For example, the footprint of the upper surface 128 of the DTI structure 126 corresponds to an area occupied by a vertical projection of the upper surface 128 of the DTI structure 126 onto a first lateral plane, where the first lateral plane extends laterally in parallel with the back side 102b of the substrate 102, and the footprint of the doped well 124 corresponds to an area occupied by a vertical projection of the doped well 124 onto the first lateral plane. In further embodiments, a thickest portion of the DTI structure (e.g., a portion of the DTI structure 126 disposed nearest to the back side 102b of the substrate 102 than any other portion of the DTI structure 126) has a footprint that is disposed within the footprint of the doped well 124. In other words, a largest footprint of the DTI structure 126 may be disposed within the footprint of the doped well 124. In yet further embodiments, the footprint of the doped well 124 corresponds to a largest footprint of the doped well 124.

A photodetector 130 (e.g., photodiode) is disposed in the substrate 102. The photodetector 130 is also disposed in the pixel region 103. The photodetector 130 is configured to absorb incident radiation (e.g., light) and generate electrical signals corresponding to the incident radiation. In other words, the photodetector 130 is photosensitive. The transfer gate 114 is configured to selectively form a conductive channel between the photodetector 130 and the floating diffusion node 112, such that charges accumulated in the photodetector 130 (e.g., via absorbing the incident radiation) may be transferred to the floating diffusion node 112.

In some embodiments, the photodetector 130 is photosensitive due to the photodetector 130 comprising a depletion region. In further embodiments, at least a portion of the depletion region may be induced by the DTI structure 126 (e.g., fixed charges in the DTI structure 126 (and/or fixed charges generated by a process for forming the DTI structure 126) may induce the depletion region). In further embodiments, at least a portion of the depletion region may be induced by the doped well 124 (e.g., due to a p-n junction between the doped well 124 and the second doped region 106). In yet further embodiments, the depletion region may be induced by other regions of the substrate 102 having the second doping type that adjoin the first doped region 104 and/or the second doped region 106 (e.g., regions of the substrate 102 overlying the second doped region 106 and having the first doping type). In some embodiments, the photodetector 130 may also be disposed in the third doped region 108.

Because the doped well 124 partially extends into the substrate 102, a size of the pixel region 103 (e.g., a size of a footprint of the pixel region 103) may be reduced in comparison to a size of a pixel region of a typical CIS. Thus, because the size of the pixel region 103 may be reduced in comparison to the size of the pixel region of the typical CIS, the image sensor of the present disclosure may have more scaled down dimensions than the typical CIS. In some embodiments, the doped well 124 partially extending into the substrate 102 may reduce the size of the pixel region 103 in comparison to the size of the pixel region of a typical CIS due to, at least partially, the ability to form the doped well with a relatively short (e.g., thin) masking layer (e.g., a trench formed in a thin making layer may have a smaller width than a corresponding trench formed in a thick masking layer).

Further, because the DTI structure 126 is disposed within the footprint of the doped well 124, the size of the pixel region 103 may be reduced in comparison to the size of the pixel region of the typical image sensor while still having good electrical performance (e.g., good electrical isolation between neighboring photodetectors, good full well capacity, etc.). Accordingly, the image sensor of the present disclosure may have more scaled down dimensions than the typical CIS while also potentially having performance metrics that meet or exceed performance metrics of the typical CIS. In some embodiments, the DTI structure 126 being disposed within the footprint of the doped well 124 may provide the image sensor with good performance metrics due to, at least partially, the combination of the DTI structure 126 and the doped well 124 providing good electrical isolation between neighboring pixel regions and/or the combination of the DTI structure 126 and the doped well 124 inducing the depletion region of the photodetector 130 (e.g., allowing the photodetector 130 to consume a larger area of the pixel region 103 than the photodetector of a typical CIS).

Moreover, because the second doped region 106 (directly) contacts both of the opposite inner sidewalls of the DTI structure 126 (and because the second doped region 106 (directly) contacts both of the opposite inner sides of the doped well 124), rather than being laterally spaced, a size of the pixel region 103 may be further reduced in comparison to a size of a pixel region of a typical CIS. Accordingly, the image sensor of the present disclosure may have more scaled down dimensions than the typical CIS.

FIG. 2 illustrates a cross-sectional view 200 of some embodiments of the image senor of FIG. 1. The cross-sectional view 200 of FIG. 2 is taken along line A-A of FIG. 1. The DTI structure 126 is shown in phantom (illustrated by a dashed line) in the cross-sectional view 200 of FIG. 2.

As shown in the cross-sectional view 200 of FIG. 2, a footprint of the DTI structure 126 is disposed in within a footprint of the doped well 124. The doped well 124 laterally surrounds the photodetector 130. The DTI structure 126 also laterally surrounds the photodetector 130. The doped well 124 laterally surrounds the pixel region 103. The DTI structure 126 also laterally surrounds the pixel region 103.

Also shown in the cross-sectional view 200 of FIG. 2, a first portion of the doped well 124 is disposed in the pixel region 103 (e.g., an inner ring-shaped portion of the doped well 124) and a second portion of the doped well 124 is disposed outside the pixel region 103 (e.g., an outer ring-shaped portion of the doped well 124). The second portion of the doped well 124 may laterally surround the first portion of the doped well 124. A first portion of the DTI structure 126 is disposed in the pixel region 103 (e.g., an inner ring-shaped portion of the DTI structure 126) and a second portion of the DTI structure 126 is disposed outside the pixel region 103 (e.g., an outer ring-shaped portion of the DTI structure 126). The second portion of the DTI structure 126 may laterally surround the first portion of the DTI structure 126.

Also shown in the cross-sectional view 200 of FIG. 2, in some embodiments, a layout of the doped well 124 has a grid-like shape. As such, the footprint of the doped well 124 has the grid-like shape. The grid-like shape of the doped well 124 comprises longitudinal portions 124L of the doped well 124 and transverse portions 124T of the doped well 124. The longitudinal portions 124L of the doped well 124 extend in parallel with one another in a first lateral direction. The transverse portions 124T of the doped well 124 extend in parallel with one another in a second lateral direction that is perpendicular to the first lateral direction. The longitudinal portions 124L of the doped well 124 and the transverse portions 124T of the doped well 124 intersect one another. The regions of the doped well 124 where the longitudinal portions 124L of the doped well 124 intersect the transverse portions 124T of the doped well 124 may be referred to as intersection portions of the doped well 124 (the intersection portions of the doped well 124 are not labeled in FIG. 2 for clarity in the figures).

Also shown in the cross-sectional view 200 of FIG. 2, in some embodiments, a layout of the DTI structure 126 has a grid-like shape. As such, the footprint of the DTI structure 126 has the grid-like shape. The grid-like shaped footprint of the DTI structure 126 is disposed within the grid-like shaped footprint of the doped well 124. The grid-like shape of the DTI structure 126 comprises longitudinal portions 126L of the DTI structure 126 and transverse portions 126T of the DTI structure 126. The longitudinal portions 126L of the DTI structure 126 extend in parallel with one another in the first lateral direction. The transverse portions 126T of the DTI structure 126 extend in parallel with one another in the second lateral direction. The longitudinal portions 126L of the DTI structure 126 and the transverse portions 126T of the DTI structure 126 intersect one another. The regions of the DTI structure 126 where the longitudinal portions 126L of the DTI structure 126 intersect the transverse portions 126T of the DTI structure 126 may be referred to as intersection portions of the DTI structure 126 (the intersection portions of the DTI structure 126 are not labeled in FIG. 2 for clarity in the figures).

FIG. 3 illustrates a cross-sectional view 300 of some embodiments of the image senor of FIG. 1.

As shown in the cross-sectional view 300 of FIG. 3, the second doped region 106 has a first portion 302 and a second portion 304. The first portion 302 of the second doped region 106 is disposed in the pixel region 103. The second portion 304 of the second doped region 106 is disposed outside the pixel region 103. It will be appreciated that, in some embodiments, the second portion 304 of the second doped region 106 is disposed in a different pixel region that neighbors the pixel region 103.

The doped well 124 overlies the first portion 302 of the second doped region 106. A first portion of the doped well 124 is disposed (directly) vertically between the first portion 302 of the second doped region 106 and the front side 102f of the substrate 102. The doped well 124 overlies the second portion 304 of the second doped region 106. A second portion of the doped well 124 is disposed (directly) vertically between the second portion 304 of the second doped region 106 and the front side 102f of the substrate 102. A third portion of the doped well 124 is disposed (directly) vertically between the DTI structure 126 and the front side 102f of the substrate 102, and the third portion of the doped well 124 is disposed laterally between the first portion of the doped well 124 and the second portion of the doped well 124.

The first portion 302 of the second doped region 106 has a first doping concentration of the second doping type dopants. The second portion 304 of the second doped region 106 has a second doping concentration of the second doping type dopants. In some embodiments, the first doping concentration is within ten percent (10%) of the second doping concentration. In other words, the first doping concentration is at least ninety percent (90%) of the second doping concentration. In further embodiments, the first doping concentration is within six percent (6%) of the second doping concentration.

Also shown in the cross-sectional view 300 of FIG. 3, FIG. 3 comprises a line B-B' that extends laterally through the second doped region 106 and laterally through a portion of the DTI structure 126. More specifically, the line B-B' extends laterally through the second portion 304 of the second doped region 106 and the first portion 302 of the second doped region 106. In some embodiments, a doping concentration of the second doping type dopants of the second doped region 106 varies by no more than ten percent (10%) from B to B' along line B-B'. In further embodiments, the doping concentration of the second doping type dopants of the second doped region 106 varies by no more than six percent (6%) from B to B' along line B-B'.

Also shown in the cross-sectional view 300 of FIG. 3, the second doped region 106 (directly) contacts the DTI structure 126. In some embodiments, the first doped region 104 (directly) contacts the DTI structure 126. In some embodiments, it may be an indication that the second doped region 106 contacts the DTI structure 126 along line B-B' if the doping concentration of the second doping type dopants of the second doped region 106 varies by no more than ten percent (10%) from B to B' along line B-B'. In other words, it may be an indication that some other doped region laterally separates the second doped region 106 from the DTI structure 126 along line B-B' if the doping concentration of the second doping type dopants of the second doped region 106 varies by more than ten percent (10%) from B to B' along line B-B'. In further embodiments, it may be an indication that the second doped region 106 contacts the DTI structure 126 along line B-B' if the doping concentration of the second doping type dopants of the second doped region 106 varies by no more than six percent (6%) from B to B' along line B-B'. In other words, it may be an indication that some other doped region laterally separates the second doped region 106 from the DTI structure 126 along line B-B' if the doping concentration of the second doping type dopants of the second doped region 106 varies by more than six percent (6%) from B to B' along line B-B'.

Also shown in the cross-sectional view 300 of FIG. 3, a shallow trench isolation (STI) structure 306 may be disposed in the substrate 102. The STI structure 306 is disposed in the doped well 124. The STI structure 306 extends into the substrate 102 from the front side 102f of the substrate 102. The STI structure 306 may have angled sidewalls. In other embodiments, the sidewalls of the STI structure 306 may be substantially straight (e.g., vertical). In some embodiments, the STI structure 306 may be or comprise, for example, an oxide (e.g., silicon dioxide ($SiO_2$)), a nitride (e.g., silicon nitride (SiN)), an oxy-nitride (e.g., silicon oxy-nitride (SiON)), a carbide (e.g., silicon carbide (SiC)), some other dielectric material, or a combination of the foregoing.

In some embodiments, a footprint of the STI structure 306 is disposed within the footprint of the doped well 124. The footprint of the STI structure 306 may be disposed within the footprint of the DTI structure 126. In some embodiments, the DTI structure 126 is vertically spaced from the STI structure 306. In further embodiments, a portion of the doped well 124 (e.g., the third portion of the doped well 124) is disposed (directly) vertically between the DTI structure 126 and the front side 102f of the substrate 102. In other embodiments, the DTI structure 126 may (directly) contact the STI structure 306.

Figure 4:
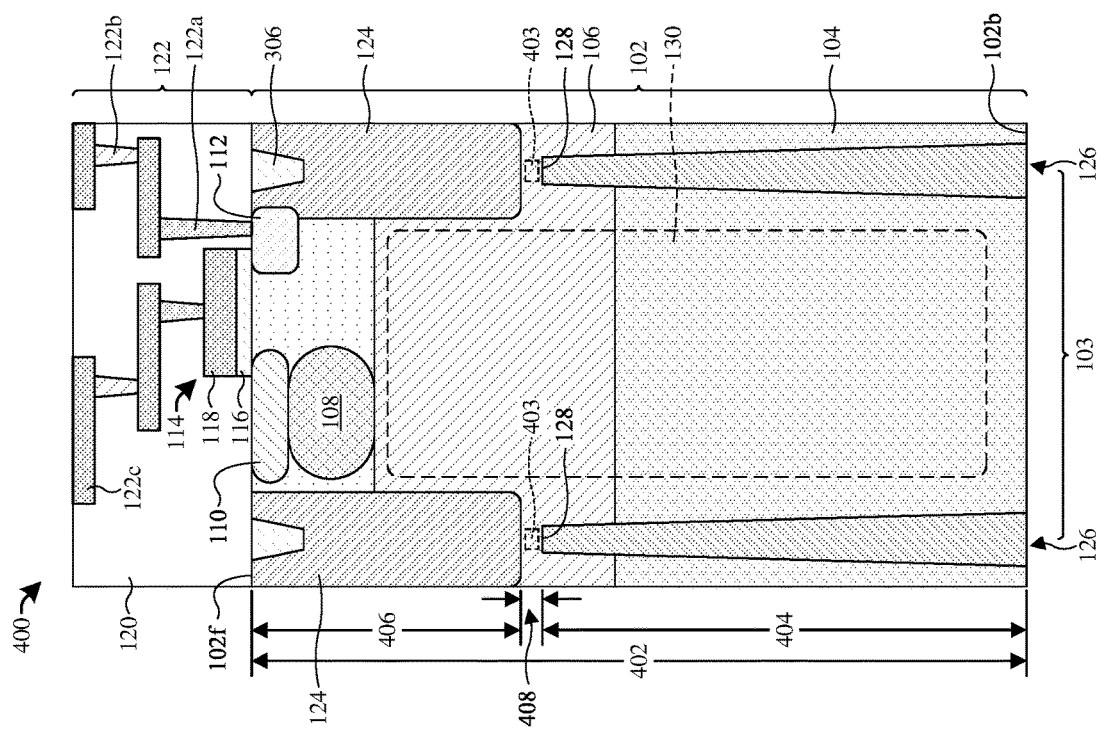
FIG. 4 illustrates a cross-sectional view of some other embodiments of the image sensor of FIG. 1.

FIG. 4 illustrates a cross-sectional view 400 of some other embodiments of the image sensor of FIG. 1.

As shown in the cross-sectional view 400 of FIG. 4, the substrate 102 has a thickness 402. In some embodiments, the thickness 402 is between about 2 micrometers (μm) and about 6 μm. The DTI structure 126 has a depth 404. The depth 404 may be between about 1.5 μm and about 6 μm. In some embodiments, the depth 404 is between about 2 μm and about 5.7 μm. The doped well 124 has a depth 406. The depth 406 may be between about 0.1 μm and about 2.5 μm. In some embodiments, the depth 406 is between about 0.5 μm and about 1.5 μm.

In some embodiments, the DTI structure 126 is vertically spaced from the doped well 124. In further embodiments, the upper surface 128 of the DTI structure 126 is vertically spaced from the doped well 124. In such embodiments, a third portion 403 of the second doped region 106 is disposed (directly) vertically between the upper surface 128 of the DTI structure 126 and the doped well 124. In some embodiments, the DTI structure 126 is vertically spaced from the doped well 124 by a first distance 408. In some embodiments, the first distance 408 is greater than about 0 µm and less than or equal to about 5.3 µm.

In some embodiments, the thickness 402 may be about 3 µm. In such embodiments, the first distance 408 may be greater than about 0 µm and less than or equal to about 0.7 µm. In other embodiments, the thickness 402 may be about 6 µm. In such embodiments, the first distance 408 may be greater than about 0 µm and less than or equal to about 5.3 µm.

Figure 5:
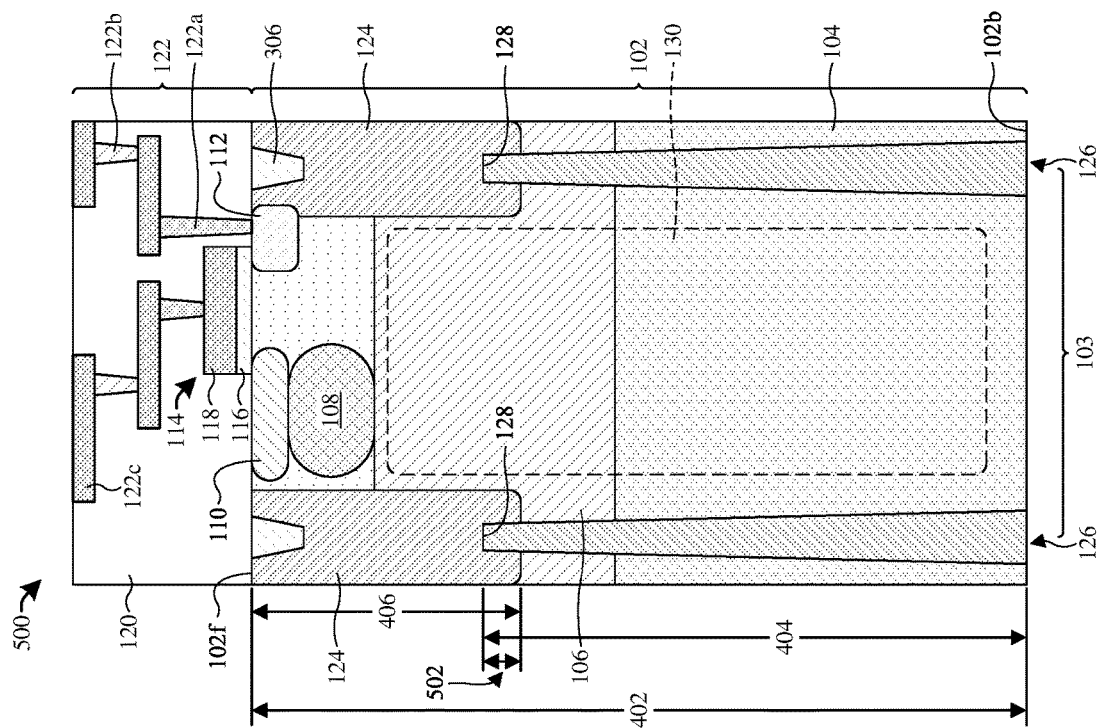
FIG. 5 illustrates a cross-sectional view of some other embodiments of the image sensor of FIG. 1.

FIG. 5 illustrates a cross-sectional view 500 of some other embodiments of the image sensor of FIG. 1.

As shown in the cross-sectional view 500 of FIG. 5, in some embodiments, the DTI structure 126 (directly) contacts the doped well 124. In some embodiments, the DTI structure 126 extends vertically into the doped well 124 by a second distance 502. The second distance 502 may be greater than about 0 µm and less than or equal to about 1.5 µm. In some embodiments, the thickness 402 may be about 3 µm. In such embodiments, the second distance 502 may be greater than about 0 µm and less than or equal to about 0.5 µm. In other embodiments, the thickness 402 may be about 6 µm. In such embodiments, the second distance 502 may be greater than about 0 µm and less than or equal to about 1.5 µm.

It will be appreciated that, in some embodiments, the DTI structure 126 may (directly) contact the doped well 124 without extending into the doped well 124 (e.g., the second distance is 0 µm (and/or the first distance is 0 µm)). In such embodiments, the upper surface 128 of the DTI structure 126 may (directly) contact a bottom side of the doped well 124 (e.g., the upper surface 128 of the DTI structure 126 and the bottom side of the doped well 124 contact one another by direct surface contact). For example, as shown in the cross-sectional view 100 of FIG. 1, the upper surface 128 of the DTI structure 126 (directly) contacts a bottom side of the doped well 124 (e.g., a distance between the upper surface 128 of the DTI structure 126 and the bottom side of the doped well 124 is 0 µm). The DTI structure 126 being spaced from the doped well 126 (see, e.g., FIG. 4), the DTI structure 126 extending into the doped well 124 (see, e.g., FIG. 5), and the DTI structure 126 contacting the bottom side of the doped well 124 (see, e.g., FIG. 1) may each provide their own benefits. For example, in some embodiments, pixel isolation performance of the image sensor may improve as the second distance 502 increases, and image performance (e.g., full well capacity performance, noise performance, etc.) of the image sensor may improve as the first distance 408 increases. Thus, the depth 404 of the DTI structure 126 and/or the depth 406 of the doped well 124 may be tuned to ensure the image sensor has some predefined performance characteristics.

Figure 6:
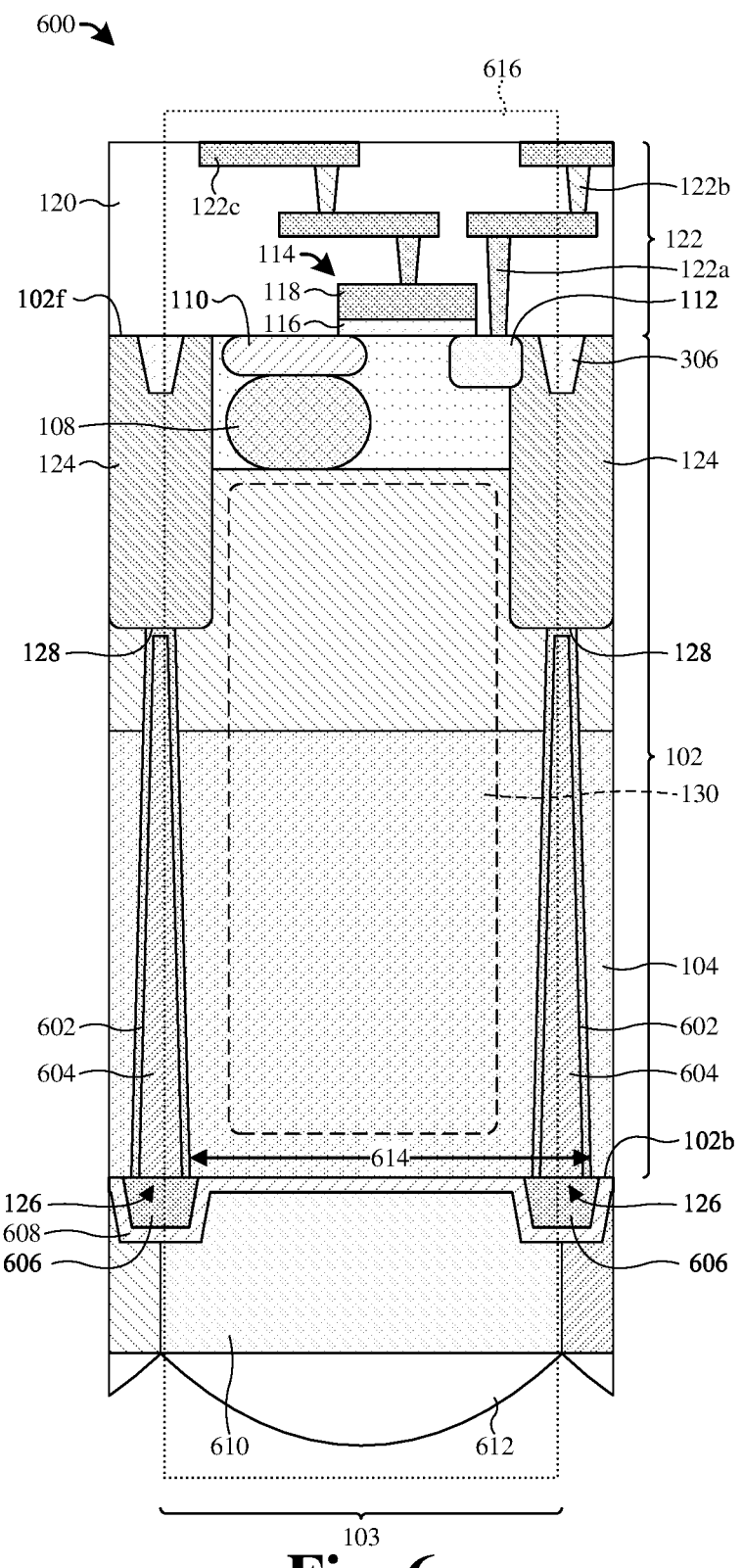
FIG. 6 illustrates a cross-sectional view of some other embodiments of the image sensor of FIG. 1.

FIG. 6 illustrates a cross-sectional view 600 of some other embodiments of the image sensor of FIG. 1.

As shown in the cross-sectional view 600 of FIG. 6, in some embodiments, the DTI structure 126 comprises a dielectric liner structure 602 and a dielectric filler structure 604. The dielectric liner structure 602 lines the substrate 102 and lines surfaces (e.g., sidewalls and upper surfaces) of the dielectric filler structure 604. In embodiments in which the DTI structure 126 comprises the dielectric liner structure 602 and the dielectric filler structure 604, the upper surface 128 of the DTI structure 126 may be defined by an upper surface of the dielectric liner structure 602.

In some embodiments, the dielectric liner structure 602 may be or comprise, for example, a high-k dielectric material (e.g., HfO, TaO, HfSiO, HfTaO, AlO, ZrO, etc.), an oxide (e.g., SiO$_2$), a nitride (e.g., SiN), an oxy-nitride (e.g., SiON), a carbide (e.g., silicon carbide (SiC)), some other dielectric material, or a combination of the foregoing. In some embodiments, the dielectric filler structure 604 may be or comprise, for example, an oxide (e.g., SiO$_2$), a nitride (e.g., SiN), an oxy-nitride (e.g., SiON), tetraethoxysilane (TEOS), some other dielectric material, or a combination of the foregoing. In some embodiments, the dielectric filler structure 604 has a first chemical composition (e.g., TEOS), and the dielectric liner structure 602 has a second chemical composition different than the first chemical composition (e.g., a high-k dielectric material). In some embodiments, a lower surface of the dielectric liner structure 602 may be substantially co-planar with the back side 102b of the substrate 102. In some embodiments, a lower surface of the dielectric filler structure 604 may be substantially co-planar with the back side 102b of the substrate 102.

In some embodiments, an isolation grid 606 is disposed along the back side 102b of the substrate 102. In some embodiments, the isolation grid 606 is disposed along a lower surface of the DTI structure 126. The isolation grid 606 may be or comprise, for example, a metal (e.g., tungsten (W), aluminum (Al), cobalt (Co), copper (Cu), silver (Ag), gold (Au), some other metal, or a combination of the foregoing), an oxide (e.g., SiO2), a nitride (e.g., SiN), a carbide (e.g., SiC), a high-k dielectric material (e.g., HfO, TaO, etc.), a low-k dielectric material, some other isolation material, or a combination of the foregoing.

In some embodiments, a dielectric layer 608 is disposed along the back side 102b of the substrate 102 and along the isolation grid 606. The dielectric layer 608 may line the back side 102b of the substrate 102 and the isolation grid 606. In some embodiments, the dielectric layer 608 is or comprises, for example, an oxide (e.g., SiO2), a nitride (e.g., SiN), a carbide (e.g., SiC), a high-k dielectric material (e.g., HfO, TaO, etc.), a low-k dielectric material, or the like.

In some embodiments, an electromagnetic radiation (EMR) filter 610 (e.g., color filter, infrared filter, etc.) is disposed along the dielectric layer 608 and within the isolation grid 606. In some embodiments, the EMR filter 610 is substantially centered over the pixel region 103. The dielectric layer 608 may vertically separate the EMR filter 610 from the back side 102b of the substrate 102. The EMR filter 610 is configured to transmit specific wavelengths (or specific ranges of wavelengths) of incident radiation. It will be appreciated that the EMR filter 610 may be one EMR filter of a plurality of EMR filters disposed within the isolation grid 606. In some embodiments, the isolation grid 606 is configured to improve the performance of the EMR filter 610 (e.g., by reflecting certain portions of the incident radiation).

In some embodiments, a micro-lens 612 is disposed along the EMR filter 610. In some embodiments, the EMR filter 610 vertically separates the micro-lens 612 from the back side 102b of the substrate 102. In some embodiments, the micro-lens 612 is substantially centered over the pixel region 103. The micro-lens 612 is configured to focus the incident radiation towards the photodetector 130. It will be appreciated that the micro-lens 612 may be one micro-lens of a plurality of micro-lenses disposed along the plurality of EMR filters.

Also shown in the cross-sectional view 600 of FIG. 6, the image sensor has a pixel pitch 614. In some embodiments, the pixel pitch 614 is between about 0.2 µm and about 2 µm.

It will be appreciated that, in other embodiments, the pixel pitch 614 may be less than 0.2 μm or greater than 2 μm.

Also shown in the cross-sectional view 600 of FIG. 6, the image sensor comprises a pixel sensor unit 616. The pixel sensor unit 616 comprises the pixel region 103 of the substrate 102 and doped regions of the substrate 102 that are disposed in the pixel region 103 (e.g., the portion of the first doped region 104 disposed in the pixel region 103, the portion of the second doped region 106 disposed in the pixel region 103, the third doped region 108, the fourth doped region 110, the floating diffusion node 112, the portion of the doped well 124 disposed in the pixel region 103, etc.). The pixel sensor unit 616 also comprises portions of features (e.g., structural features) disposed in the pixel region 103. For example, the pixel sensor unit 616 comprises the portion of the DTI structure 126 disposed in the pixel region 103 (and comprises the portion of the STI structure 306 disposed in the pixel region 103). Further, the pixel sensor unit 616 comprises the transfer gate 114. Moreover, the pixel sensor unit 616 may comprise portions of features (e.g., structural features) that overlie/underlie the pixel region 103. For example, the pixel sensor unit 616 may comprise a portion of the isolation grid 606 that underlies the pixel region 103, a portion of the dielectric layer 608 that underlies the pixel region 103, the EMR filter 610, the micro-lens 612, etc. It will be appreciated that the pixel sensor unit 616 may comprise other features not illustrated in FIG. 6 (e.g., a storage node, an anti-blooming gate, a reset transistor, a source follower transistor, a row-select transistor, or the like) that are used to facilitate the readout (e.g., digital readout) of the incident radiation recorded by the photodetector 130 and/or other features not illustrated in FIG. 6 that are disposed in, underlie, or overlie the pixel region 103.

Figure 7:
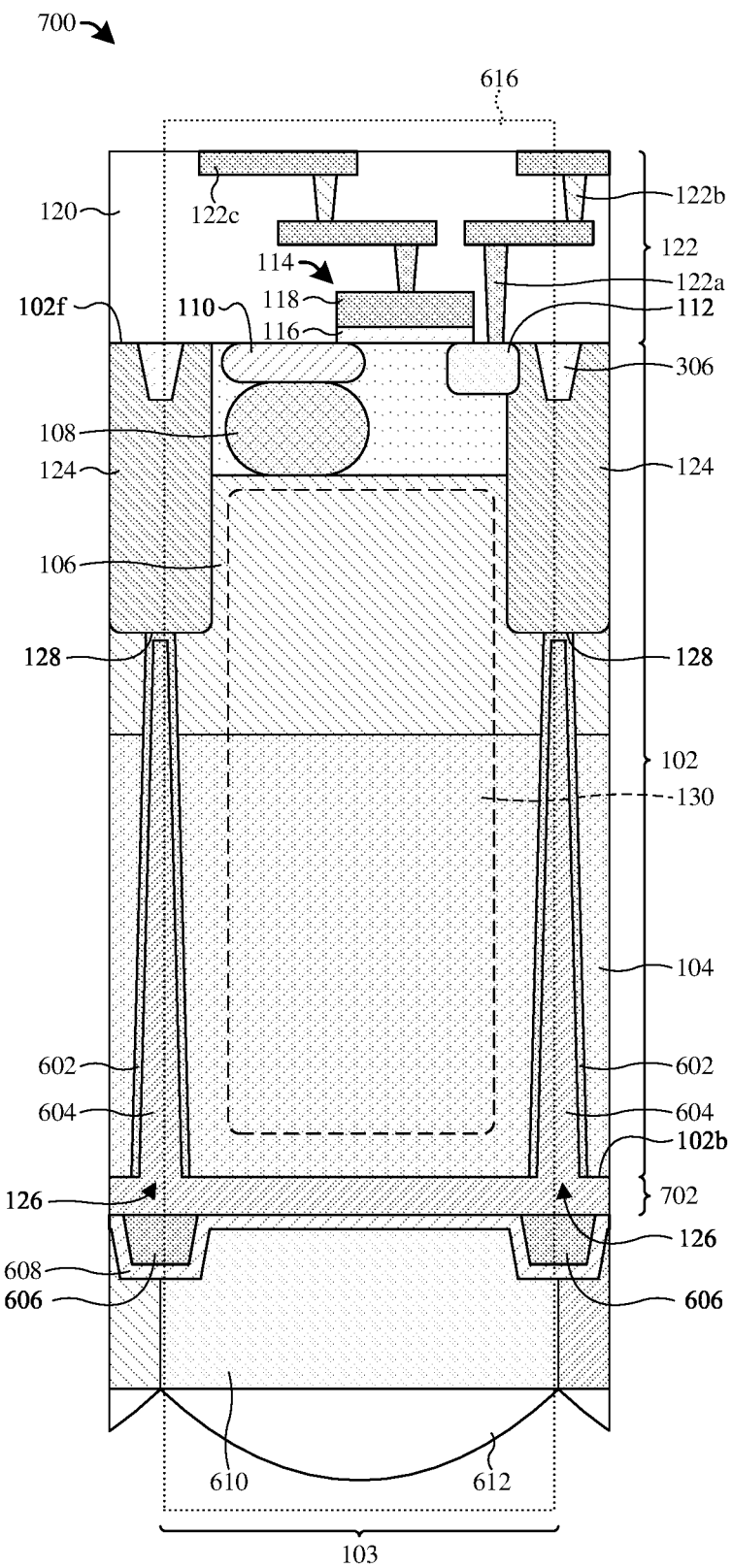
FIG. 7 illustrates a cross-sectional view of some other embodiments of the image sensor of FIG. 6.

FIG. 7 illustrates a cross-sectional view 700 of some other embodiments of the image sensor of FIG. 6.

As shown in the cross-sectional view 700 of FIG. 7, in some embodiments, a portion 702 of the dielectric filler structure 604 is disposed along the back side 102b of the substrate 102. Vertical portions of the dielectric filler structure 604 extend into the substrate 102 from the portion 702 of the dielectric filler structure 604 and define, at least partially, the DTI structure 126. The portion 702 of the dielectric filler structure 604 may vertically separate the isolation grid 606 and/or the dielectric layer 608 from the back side 102b of the substrate 102. In some embodiments, the portion 702 of the dielectric filler structure 604 may be referred to as a dielectric layer. In further embodiments, the pixel sensor unit 616 comprises the region of the portion 702 of the dielectric filler structure 604 that underlies the pixel region 103.

Figure 8:
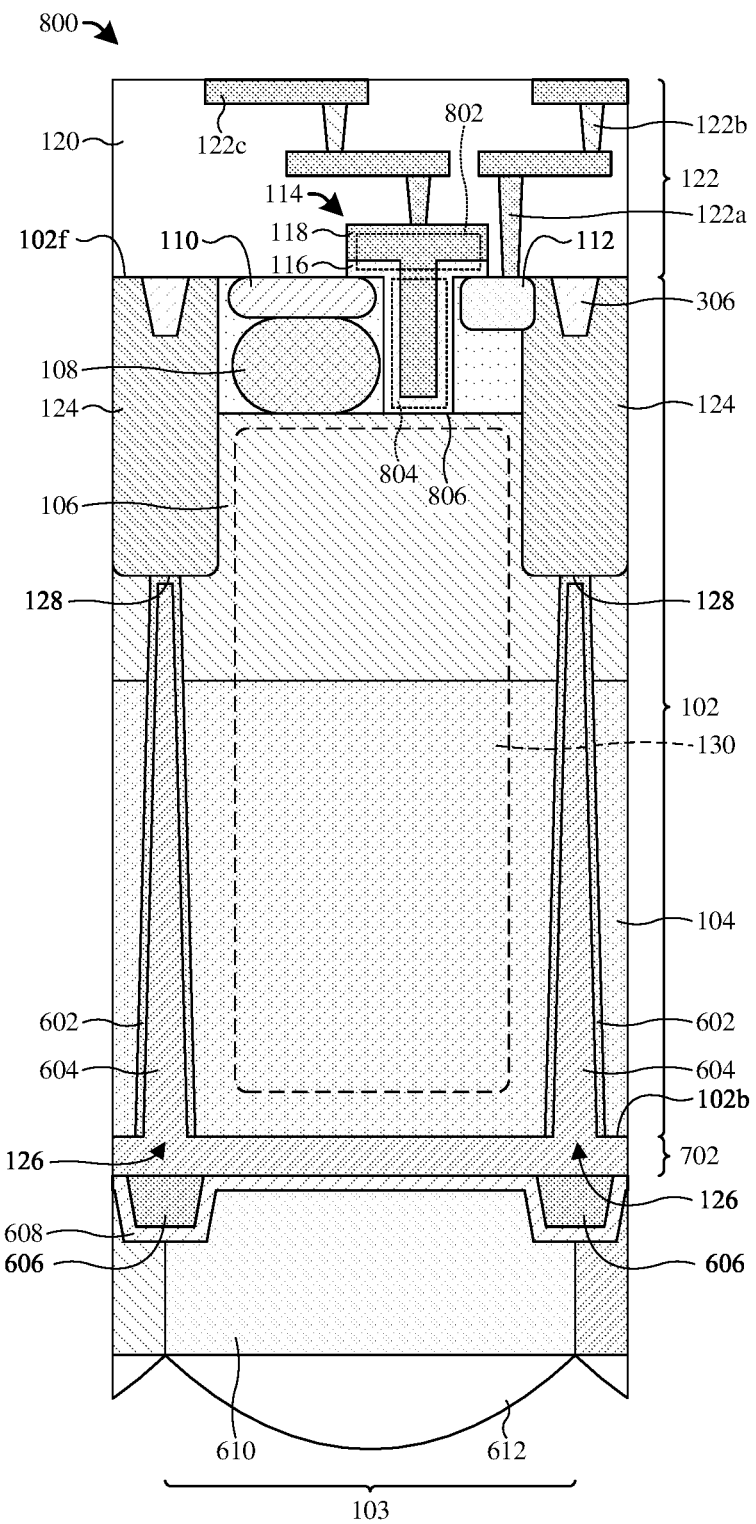
FIG. 8 illustrates a cross-sectional view of some other embodiments of the image sensor of FIG. 7.

FIG. 8 illustrates a cross-sectional view 800 of some other embodiments of the image sensor of FIG. 7.

As shown in the cross-sectional view 800 of FIG. 8, the transfer gate 114 comprises an upper portion 802 and a lower portion 804. The upper portion 802 of the transfer gate 114 overlies the front side 102f of the substrate 102. The upper portion 802 of the transfer gate 114 comprises an upper portion of the gate dielectric structure 116 and an upper portion of the gate electrode structure 118. The lower portion 804 of the transfer gate 114 extends vertically from the upper portion 802 of the transfer gate 114 into the substrate 102. The lower portion 804 of the transfer gate 114 comprises a lower portion of the gate dielectric structure 116 and a lower portion of the gate electrode structure 118. In embodiments in which the transfer gate 114 comprises the upper portion 802 and the lower portion 804, the transfer gate 114 may be referred to as a vertical transfer gate.

The transfer gate 114 has a lower surface 806. In some embodiments, the lower surface 806 is defined by a lower surface of the lower portion of the gate dielectric structure 116. The lower surface 806 of the transfer gate 114 may be disposed vertically between the front side 102f of the substrate 102 and the back side 102b of the substrate 102. The lower surface 806 of the transfer gate 114 may be disposed vertically between the front side 102f of the substrate and a lower side of the doped well 124. In some embodiments, the lower surface 806 of the transfer gate 114 is disposed vertically between the upper surface 128 of the DTI structure 126 and the front side 102f of the substrate 102.

In some embodiments, the lower surface 806 of the transfer gate 114 is substantially aligned with an upper side of the second doped region 106 (e.g., aligned along a lateral plane), as shown in the cross-sectional view 800 of FIG. 8. In other embodiments, the lower surface 806 of the transfer gate 114 is disposed vertically between the upper side of the second doped region 106 and the front side 102f of the substrate 102. In yet other embodiments, the lower surface 806 of the transfer gate 114 is disposed vertically between the upper side of the second doped region 106 and the back side 102b of the substrate 102. In such embodiments, the lower portion 804 of the transfer gate 114 extends vertically into the second doped region 106.

Figure 9A:
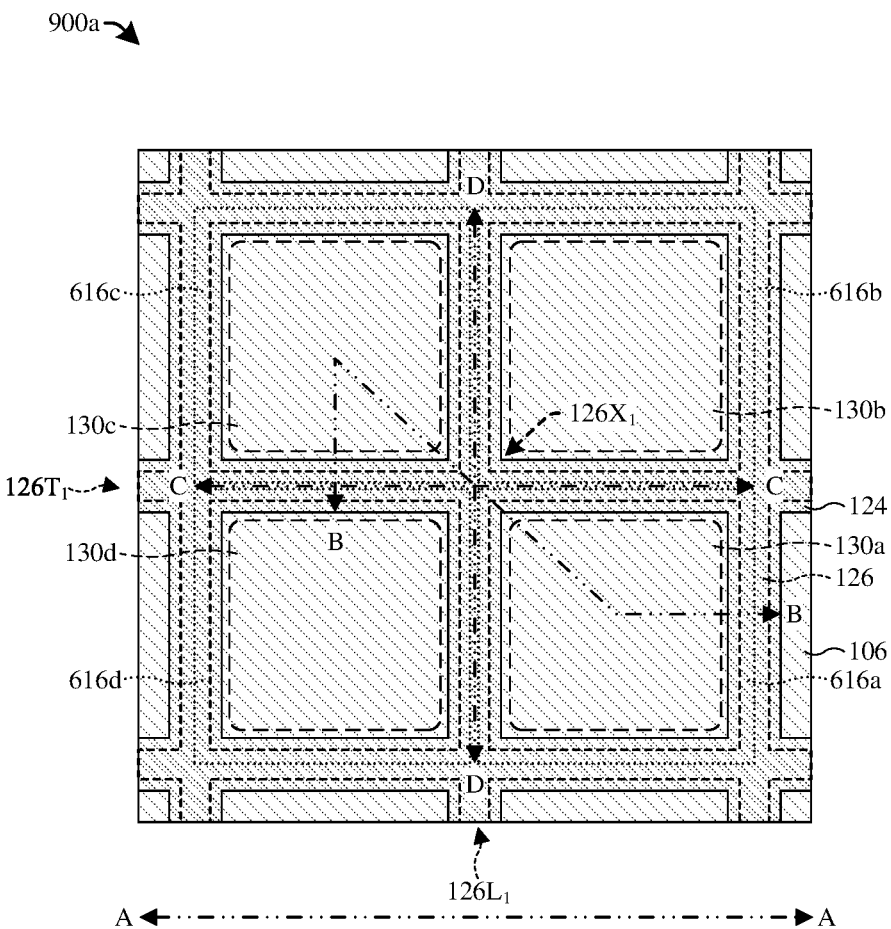
FIGS. 9A-9D illustrate various views of some embodiments of the image sensor of FIG. 6.
Figure 9B:
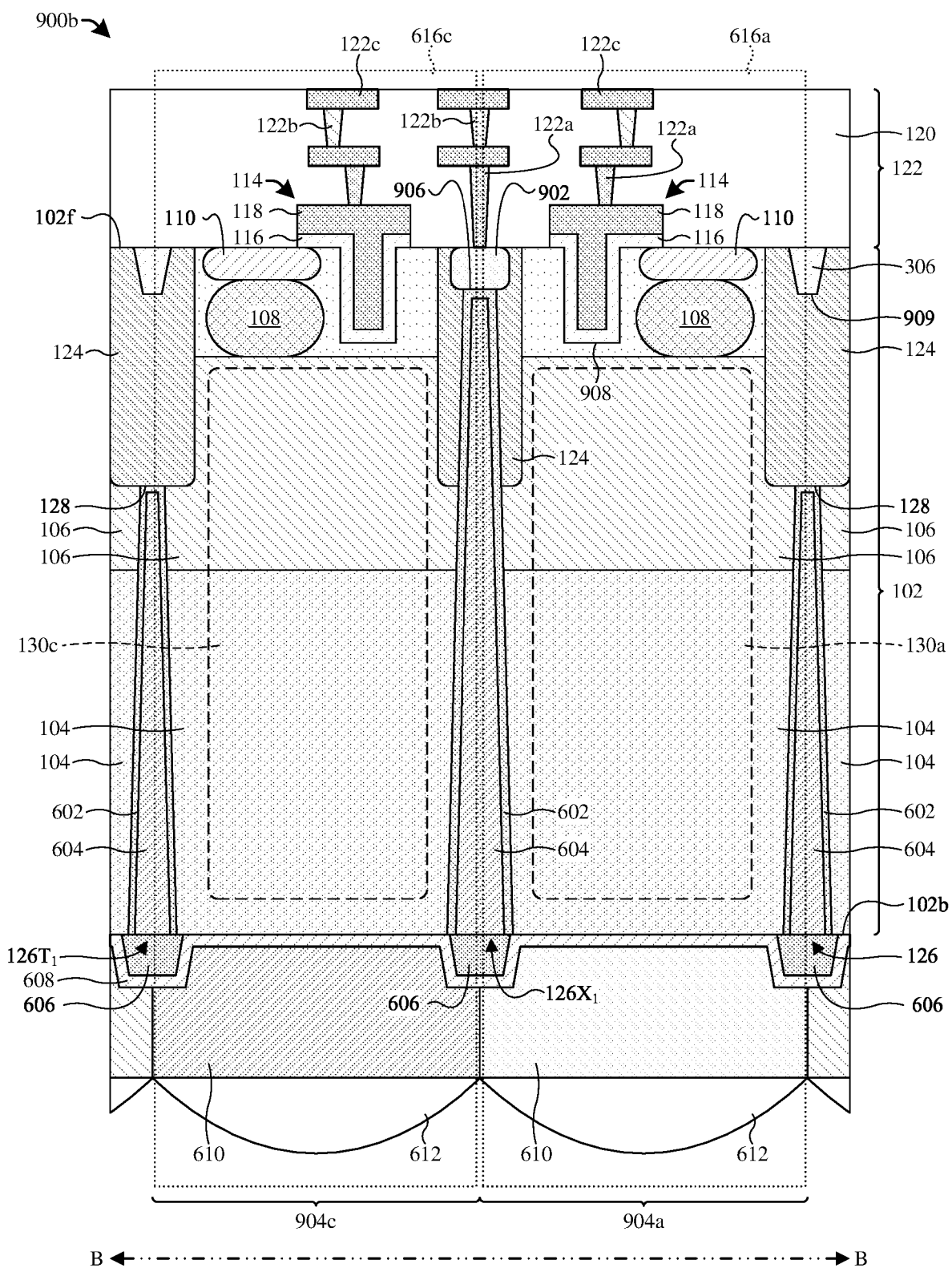
Figure 9C:
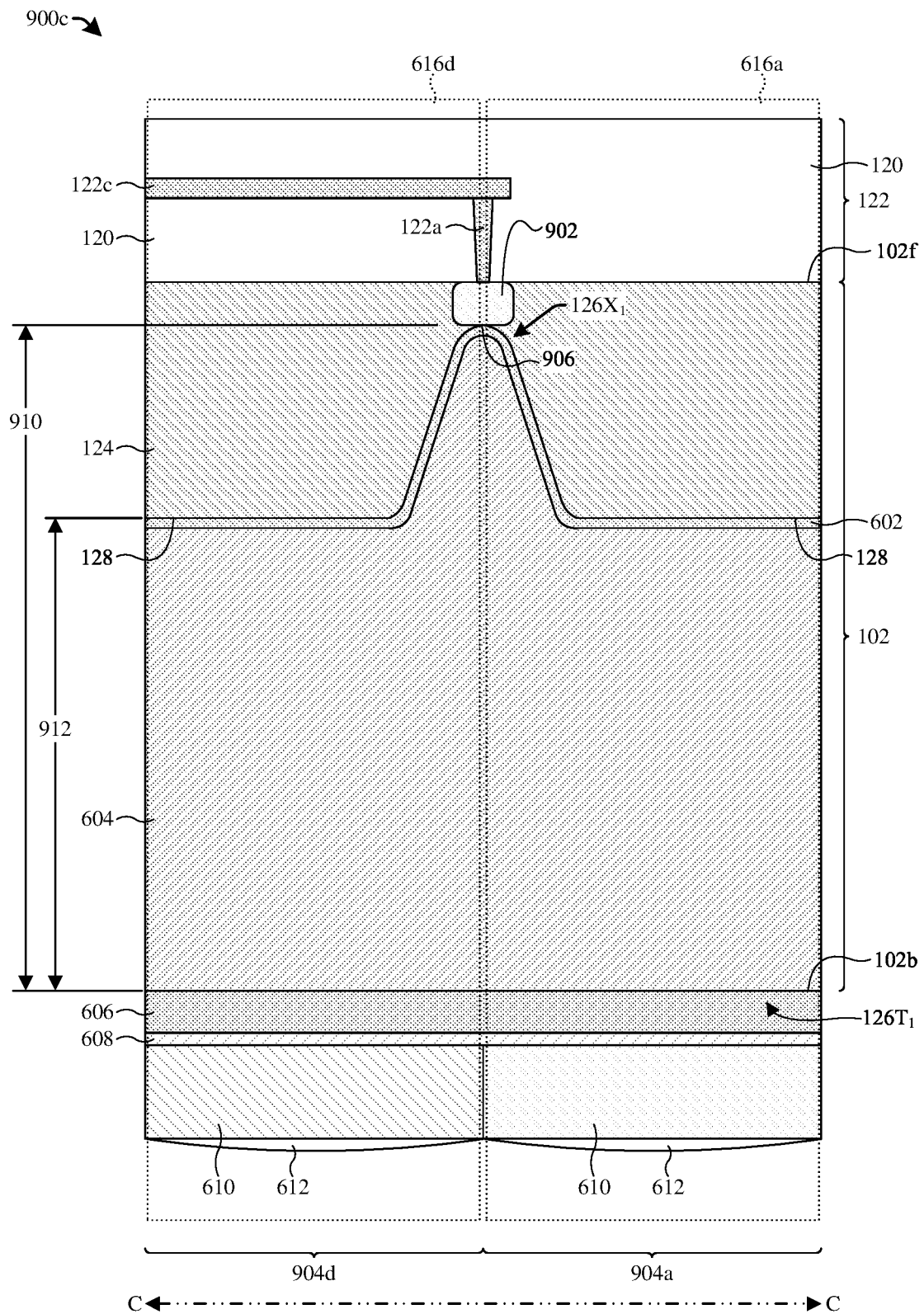
Figure 9D:
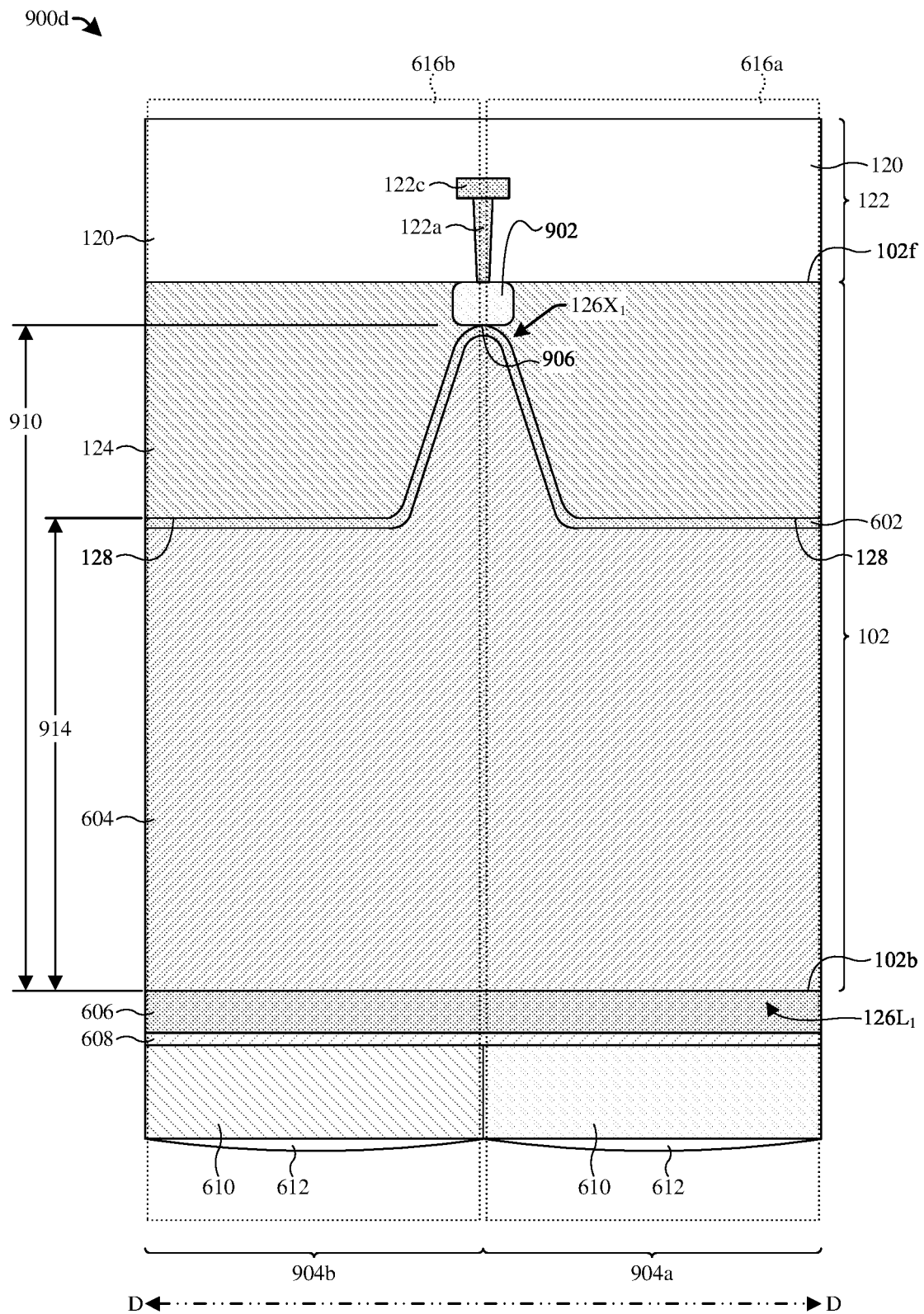

FIGS. 9A-9D illustrate various views 900a-900d of some embodiments of the image sensor of FIG. 6. More specifically, FIG. 9A illustrates a layout view 900a of some embodiments of the image sensor of FIG. 6. FIG. 9B illustrates a cross-sectional view 900b of the image sensor of FIG. 9A taken along line B-B of FIG. 9A. FIG. 9C illustrates a cross-sectional view 900c of the image sensor of FIG. 9A taken along line C-C of FIG. 9A. FIG. 9D illustrates a cross-sectional view 900d of the image sensor of FIG. 9A taken along line D-D of FIG. 9A.

As shown in the various views 900a-900d of FIGS. 9A-9D, the image sensor comprises a plurality of pixel sensor units 616a-616d. For example, the image sensor comprises a first pixel sensor unit 616a, a second pixel sensor unit 616b, a third pixel sensor unit 616c, a fourth pixel sensor unit 616d. The plurality of pixel sensor units 616a-616d may be disposed in an array comprising rows and columns. Each of the pixel sensor units of the plurality pixel sensor units 616a-616d may comprise the same features (e.g., structural features) as the pixel sensor unit 616 described herein. For example, each of the plurality of pixel sensor units 616a-616d may comprise a corresponding pixel region of the substrate 102 (see, e.g., pixel region 103 described herein), a corresponding third doped region (see, e.g., the third doped region 108 described herein), a corresponding fourth doped region (see, e.g., the fourth doped region 110 described herein), a corresponding transfer gate (see, e.g., the transfer gate 114 described herein), a corresponding EMR filter (see, e.g., the EMR filter 610 described herein), a corresponding micro-lens (see, e.g., the micro-lens 612 described herein), and so forth. It will be appreciated that the EMR filters of the plurality pixel sensor units 616a-616d may be configured to transmit different wavelengths (or different ranges of wavelengths) of incident radiation (e.g., one of the EMR filters may be a red color filter, another one may be a green color filter, another one may be a blue color filter, and so forth).

In some embodiments, the plurality of pixel sensor units 616a-616d may share a common floating diffusion node 902. The common floating diffusion node 902 is disposed in the substrate 102. The common floating diffusion node 902 is a region of the substrate 102 having the second doping type. In some embodiments, the common floating diffusion node is disposed in the doped well 124. The common floating diffusion node 902 may be laterally spaced from the third doped regions and/or the fourth doped regions of the plurality of pixel sensor units 616a-616d. In some embodiments, the common floating diffusion node 902 has a greater concentration of the second doping type dopants than the first doped region 104, the second doped region 106, and/or the third doped regions of the plurality of pixel sensor units 616a-616d.

The pixel regions of the plurality of pixel sensor units 616a-616d comprise a plurality of pixel regions 904a-904d, respectively. The common floating diffusion node 902 may also be disposed in the plurality of pixel regions 904a-904d. For example, the first pixel sensor unit 616a comprises a first pixel region 904a of the substrate 102, the second pixel sensor unit 616b comprises a second pixel region 904b of the substrate 102, the third pixel sensor unit 616c comprises a third pixel region 904c of the substrate 102, and the fourth pixel sensor unit 616d comprises a fourth pixel region 904d of the substrate 102; and the common floating diffusion node 902 is partially disposed in each of the first pixel region 904a, the second pixel region 904b, the third pixel region 904c, and the fourth pixel region 904d. The transfer gates of the plurality of pixel sensor units 616a-616d are each configured to selectively form a conductive channel between their corresponding photodetector and the common floating diffusion node 902, such that charges accumulated in the photodetectors of the plurality of pixel sensor units 616a-616d may be transferred to the common floating diffusion node 902. For example, the first pixel sensor unit 616a comprises a first photodetector 130a disposed in the first pixel region 904a, the second pixel sensor unit 616b comprises a second photodetector 130b disposed in the second pixel region 904b, the third pixel sensor unit 616c comprises a third photodetector 130c disposed in the third pixel region 904c, and the fourth pixel sensor unit 616d comprises a fourth photodetector 130d disposed in the fourth pixel region 904d. The transfer gate of the first pixel sensor unit 616a (e.g., a first transfer gate) is configured to selectively form a conductive channel between the first photodetector 130a and the common floating diffusion node 902, the transfer gate of the second pixel sensor unit 616b (e.g., a second transfer gate) is configured to selectively form a conductive channel between the second photodetector 130b and the common floating diffusion node 902, the transfer gate of the third pixel sensor unit 616c (e.g., a third transfer gate) is configured to selectively form a conductive channel between the third photodetector 130c and the common floating diffusion node 902, and the transfer gate of the fourth pixel sensor unit 616d (e.g., a fourth transfer gate) is configured to selectively form a conductive channel between the fourth photodetector 130d and the common floating diffusion node 902.

As shown in the various views 900a-900d of FIGS. 9A-9D, the doped well 124 laterally surrounds each of the plurality of pixel regions 904a-904d. The footprint of the doped well 124 has a grid-like shape. The DTI structure 126 laterally surrounds each of the plurality of pixel regions 904a-904d. The footprint of the DTI structure 126 also has a grid-like shape. The grid-like shaped footprint of the DTI structure 126 is disposed within the grid-like shaped footprint of the doped well 124.

In some embodiments, the DTI structure 126 has a first transverse portion $126T_1$ and a first longitudinal portion $126L_1$. The first transverse portion $126T_1$ of the DTI structure 126 is perpendicular to the first longitudinal portion $126L_1$ of the DTI structure 126. The first transverse portion $126T_1$ of the DTI structure 126 intersects the first longitudinal portion $126L_1$ of the DTI structure 126. The region in which the first transverse portion $126T_1$ of the DTI structure 126 intersects the first longitudinal portion $126L_1$ of the DTI structure 126 is referred to as a first intersection portion $126X_1$ of the DTI structure 126. The first intersection portion $126X_1$ of the DTI structure 126 is laterally disposed between the first photodetector 130a and the third photodetector 130c and laterally disposed between the second photodetector 130b and the fourth photodetector 130d.

In some embodiments, the common floating diffusion node 902 overlies the first intersection portion $126X_1$ of the DTI structure 126. The first intersection portion $126X_1$ of the DTI structure 126 has an upper surface 906. The upper surface 906 of the first intersection portion $126X_1$ of the DTI structure 126 is disposed vertically between the upper surface 128 of the DTI structure 126 and the front side 102f of the substrate 102. In some embodiments, lower surfaces of the transfer gates of the pixel sensor units 616a-616d (see, e.g., lower surface 806 described herein) are disposed vertically between the upper surface 906 of the first intersection portion $126X_1$ of the DTI structure 126 and the upper surface 128 of the DTI structure 126. For example, the transfer gate of the first pixel sensor unit 616a has a lower surface 908. The lower surface 908 of the transfer gate of the first pixel sensor unit 616a is disposed vertically between the upper surface 906 of the first intersection portion $126X_1$ of the DTI structure 126 and the upper surface 128 of the DTI structure 126. In some embodiments, the lower surface 908 of the transfer gate of the first pixel sensor unit 616a is substantially aligned with an upper side of the second doped region 106 (e.g., aligned along a lateral plane). In other embodiments, the lower surface 908 of the transfer gate of the first pixel sensor unit 616a is vertically spaced from the upper side of the second doped region 106. In some embodiments, a lower surface 909 of the STI structure 306 is disposed vertically between the upper surface 906 of the first intersection portion $126X_1$ of the DTI structure 126 and the upper surface 128 of the DTI structure 126.

In some embodiments, the third doped regions of the pixel sensor units 616a-616d (see, e.g., third doped region 108 described herein) are disposed vertically between the upper surface 906 of the first intersection portion $126X_1$ of the DTI structure 126 and the upper surface 128 of the DTI structure 126. For example, at least a portion of the third doped region of the first pixel sensor unit 616a is disposed vertically between the upper surface 906 of the first intersection portion $126X_1$ of the DTI structure 126 and the upper surface 128 of the DTI structure 126.

In some embodiments, at the first intersection portion $126X_1$ of the DTI structure 126, the DTI structure has a "peak." The peak is a portion of the DTI structure 126 that extends deeper into the substrate 102 than surrounding portions of the DTI structure 126. For example, the first transverse portion $126T_1$ of the DTI structure 126 has a first portion on a first side of the first intersection portion $126X_1$ of the DTI structure 126 and a second portion on a second side (opposite the first side) of the first intersection portion $126X_1$ of the DTI structure 126. The first portion of the first transverse portion $126T_1$ of the DTI structure 126 extends vertically into the substrate 102 a first distance, the second portion of the first transverse portion $126T_1$ of the DTI structure 126 extends vertically into the substrate 102 a second distance, and the first intersection portion $126X_1$ of the DTI structure 126 extends vertically into the substrate 102 a third distance. The third distance is greater than the first distance and the second distance. In some embodiments, the first distance is substantially the same as the second distance.

In some embodiments, the peak of the first intersection portion 126X$_1$ of the DTI structure 126 may have a rounded upper surface. In other embodiments, the peak of the first intersection portion 126X$_1$ of the DTI structure 126 may have a substantially flat upper surface. In some embodiments, the peak of the first intersection portion 126X$_1$ of the DTI structure 126 may have angled sidewalls that extend from the surrounding portions of the DTI structure 126 to the upper surface of the peak. In other embodiments, the peak of the first intersection portion 126X$_1$ of the DTI structure 126 may have substantially straight (e.g., substantially vertical) sidewalls that extend from the surrounding portions of the DTI structure 126 to the upper surface of the peak.

In some embodiments, the first intersection portion 126X$_1$ of the DTI structure 126 extends vertically into the doped well 124, and the surrounding portions of the DTI structure 126 are vertically spaced from the doped well 124. For example, the first portion of the first transverse portion 126T$_1$ of the DTI structure 126 and the second portion of the first transverse portion 126T$_1$ of the DTI structure 126 may be vertically spaced from the doped well 124, while the first intersection portion 126X$_1$ of the DTI structure 126 extends into the doped well 124. In other embodiments, the first intersection portion 126X$_1$ of the DTI structure 126 and the surrounding portions of the DTI structure 126 may each extend vertically into the doped well 124. For example, the first portion of the first transverse portion 126T$_1$ of the DTI structure 126, the second portion of the first transverse portion 126T$_1$ of the DTI structure 126, and the first intersection portion 126X$_1$ of the DTI structure 126 may each extend into the doped well 124. In yet other embodiments, the first intersection portion 126X$_1$ of the DTI structure 126 extends vertically into the doped well 124, and the surrounding portions of the DTI structure 126 (directly) contact the doped well 124 without extending into the doped well 124.

In some embodiments, the first intersection portion 126X$_1$ of the DTI structure 126 has a first depth 910, the transverse portions of the DTI structure 126 (see, e.g., transverse portions 126T described herein) have a second depth 912, and the longitudinal portions of the DTI structure 126 (see, e.g., longitudinal portions 126L described herein) have a third depth 914. In such embodiments, the first transverse portion 126T$_1$ of the DTI structure 126 has the second depth 912, and the first longitudinal portion 126L$_1$ of the DTI structure 126 has the third depth 914. The first depth 910 is greater than the second depth 912. The first depth 910 is greater than the third depth 914. In some embodiments, the second depth 912 is substantially the same as the third depth 914. In other embodiments, the second depth 912 is different than (e.g., less than or greater than) the third depth 914. In some embodiments, the first depth 910 is between about 2 micrometers (μm) and about 5.7 μm. In some embodiments, the second depth 912 is between about 2 μm and about 5.5 μm. In some embodiments, the third depth 914 is between about 2 μm and about 5.5 μm.

In some embodiments, the substrate 102 has a thickness (see, e.g., thickness 402 described herein) of about 3 μm. In some such embodiments, the first depth 910 is between about 2 μm and about 2.7 μm. In some such embodiments, the first depth 910 is between about 2 μm and about 2.5 μm. In some such embodiments, the second depth 912 may be about 2 μm. In some such embodiments, the second depth 912 may be about 2.5 μm. In some such embodiments, the third depth 914 may be about 2 μm. In some such embodiments, the third depth 914 may be about 2.5 μm. In some such embodiments, the first intersection portion 126X$_1$ of the DTI structure 126 extends vertically into the doped well 124. In some such embodiments, the transverse portions of the DTI structure 126 and the longitudinal portions of the DTI structure 126 may be vertically separated from the doped well 124 (see, e.g., FIG. 4), may vertically extend into the doped well 124 (see, e.g., FIG. 5), or may (directly) contact the doped well 124 without vertically extending into the doped well 124 (see, e.g., FIG. 1). In some such embodiments, if the transverse portions of the DTI structure 126 and the longitudinal portions of the DTI structure 126 are vertically separated from the doped well 124, the transverse portions of the DTI structure 126 and the longitudinal portions of the DTI structure 126 may be vertically separated from the doped well 124 by greater than about 0 μm and by less than or equal to about 0.7 μm. In some such embodiments, if the transverse portions of the DTI structure 126 and the longitudinal portions of the DTI structure 126 (directly) contact the doped well 124 without vertically extending into the doped well 124, the upper surface 128 of the DTI structure 126 may (directly) contact a bottom side of the doped well 124. In some such embodiments, if the transverse portions of the DTI structure 126 and the longitudinal portions of the DTI structure 126 vertically extend into the doped well 124, the transverse portions of the DTI structure 126 and the longitudinal portions of the DTI structure 126 may vertically extend into the doped well 124 by great than about 0 μm and by less than or equal to about 0.5 μm. In further such embodiments, if the transverse portions of the DTI structure 126 and the longitudinal portions of the DTI structure 126 vertically extend into the doped well 124, the second depth 912 and the third depth 914 may both be about 2.5 μm.

In some embodiments, the substrate 102 has a thickness (see, e.g., thickness 402 described herein) of about 6 μm. In some such embodiments, the first depth 910 is between about 4 μm and about 5.7 μm. In some such embodiments, the second depth 912 may be about 4 μm. In some such embodiments, the second depth 912 may be about 5.5 μm. In some such embodiments, the third depth 914 may be about 4 μm. In some such embodiments, the third depth 914 may be about 5.5 μm. In some such embodiments, the first intersection portion 126X$_1$ of the DTI structure 126 extends vertically into the doped well 124. In some such embodiments, the transverse portions of the DTI structure 126 and the longitudinal portions of the DTI structure 126 may be vertically separated from the doped well 124 (see, e.g., FIG. 4), may vertically extend into the doped well 124 (see, e.g., FIG. 5), or may (directly) contact the doped well 124 without vertically extending into the doped well 124 (see, e.g., FIG. 1). In some such embodiments, if the transverse portions of the DTI structure 126 and the longitudinal portions of the DTI structure 126 are vertically separated from the doped well 124, the transverse portions of the DTI structure 126 and the longitudinal portions of the DTI structure 126 may be vertically separated from the doped well 124 by greater than about 0 μm and by less than or equal to about 5.3 μm. In some such embodiments, if the transverse portions of the DTI structure 126 and the longitudinal portions of the DTI structure 126 (directly) contact the doped well 124 without vertically extending into the doped well 124, the upper surface 128 of the DTI structure 126 may (directly) contact a bottom side of the doped well 124. In some such embodiments, if the transverse portions of the DTI structure 126 and the longitudinal portions of the DTI structure 126 vertically extend into the doped well 124, the transverse portions of the DTI structure 126 and the longitudinal portions of the DTI structure 126 may vertically extend into the doped well 124 by great than about 0 µm and by less than or equal to about 1.5 µm. In further such embodiments, if the transverse portions of the DTI structure 126 and the longitudinal portions of the DTI structure 126 vertically extend into the doped well 124, the second depth 912 and the third depth 914 may both be about 5.5 µm.

Figure 10:
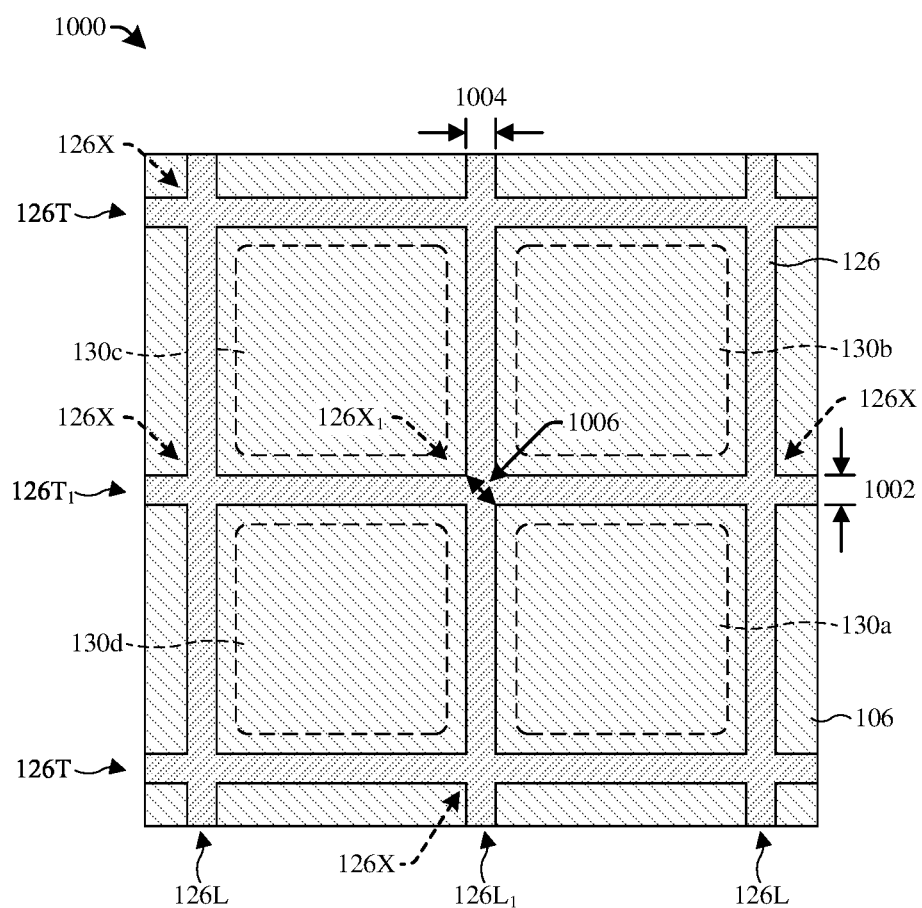
FIG. 10 illustrates a layout view of some embodiments of the image sensor of FIGS. 9A-9D.

FIG. 10 illustrates a layout view 1000 of some embodiments of the image sensor of FIGS. 9A-9D.

As shown in the layout view 1000 of FIG. 10, the first transverse portion $126T_1$ of the DTI structure 126 has a width 1002. In some embodiments, each of the transverse portions 126T of the DTI structure 126 have the width 1002. In some embodiments, the width 1002 may be referred to as a thickness (e.g., a distance between an inner diameter and outer diameter of a ring-shaped structure).

The first longitudinal portion $126L_1$ of the DTI structure 126 has a width 1004. In some embodiments, each of the longitudinal portions 126L of the DTI structure 126 have the width 1004. In some embodiments, the width 1004 may be referred to as a thickness (e.g., a distance between an inner diameter and outer diameter of a ring-shaped structure). In some embodiments, the width 1002 is substantially the same as the width 1004. In other embodiments, the width 1002 may be different than (e.g., greater than or less than) the width 1004.

Also shown in the layout view 1000 of FIG. 10, the first intersection portion $126X_1$ is one intersection portion of a plurality of intersection portions 126X of the DTI structure 126. The first intersection portion $126X_1$ of the DTI structure 126 has a dimension 1006. The dimension 1006 is a distance between opposite outer points of the first intersection portion $126X_1$ of the DTI structure 126 that lie along a plane that intersects the first intersection portion $126X_1$ of the DTI structure 126 at a diagonal. In some embodiments, the dimension 1006 is a greatest distance between two opposite outer points of the first intersection portion $126X_1$ of the DTI structure 126. In further embodiments, the first intersection portion $126X_1$ of the DTI structure 126 has a square-like shape (as viewed from a top/layout view) and the dimension 1006 corresponds to a length of the diagonal of the square-like shape. In some embodiments, each of the plurality of intersection portions 126X of the DTI structure 126 have the dimension 1006.

The dimension 1006 is greater than the width 1002 and the width 1004. In some embodiments, when the depth of the DTI structure 126 (see, e.g., first depth 910) is less than or equal to about 3 µm, the dimension $1006 \leq \sqrt{(\text{thewidth}1002)^2 + (\text{thewidth}1004)^2}$. It will be appreciated that "the dimension 1006" in the above equation refers to a value for the dimension 1006. It will be appreciated that "(the width 1002)" in the above equation refers to a value for the width 1002. It will be appreciated that "(the width 1004)" in the above equation refers to a value for the width 1004. For example, in some embodiments, the width 1002 is equal to 1 µm and the width 1004 is equal to 1 µm. In such embodiments, the above equation would be as follows: $1.414 \, \mu m \leq \sqrt{1 \mu m^2 + 1 \mu m^2}$. Thus, in such an embodiment, the dimension 1006 is less than or equal to 1.414 µm.

If the dimension $1006 > \sqrt{(\text{thewidth}1002)^2 + (\text{thewidth}1004)^2}$, in some embodiments, the depth of the DTI structure 126 (see, e.g., first depth 910 described herein) may be such that the first intersection portion $126X_1$ of the DTI structure 126 penetrates, at least partially, the common floating diffusion node 902. In some embodiments, if the first intersection portion $126X_1$ of the DTI structure 126 penetrates the common floating diffusion node 902, performance of the image sensor may be negatively affected and/or yield may be reduced (e.g., the first intersection portion $126X_1$ of the DTI structure 126 penetrating the common floating diffusion node 902 may destroy the functionality of one or more pixel sensor units of the image sensor).

In some embodiments, when the depth of the DTI structure 126 (see, e.g., first depth 910 described herein) is about 2 µm, the dimension 1006 may be greater than or equal to about 1.4 µm and less than or equal to about 1.9 µm. In some embodiments, the width 1002 may be between about 0.01 µm and about 1.5 µm. In further embodiments, the width 1002 may be between about 0.01 µm and about 0.15 µm. In some embodiments, the width 1004 may be between about 0.01 µm and about 1.5 µm. In further embodiments, the width 1004 may be between about 0.01 µm and about 0.15 pam.

Figure 11:
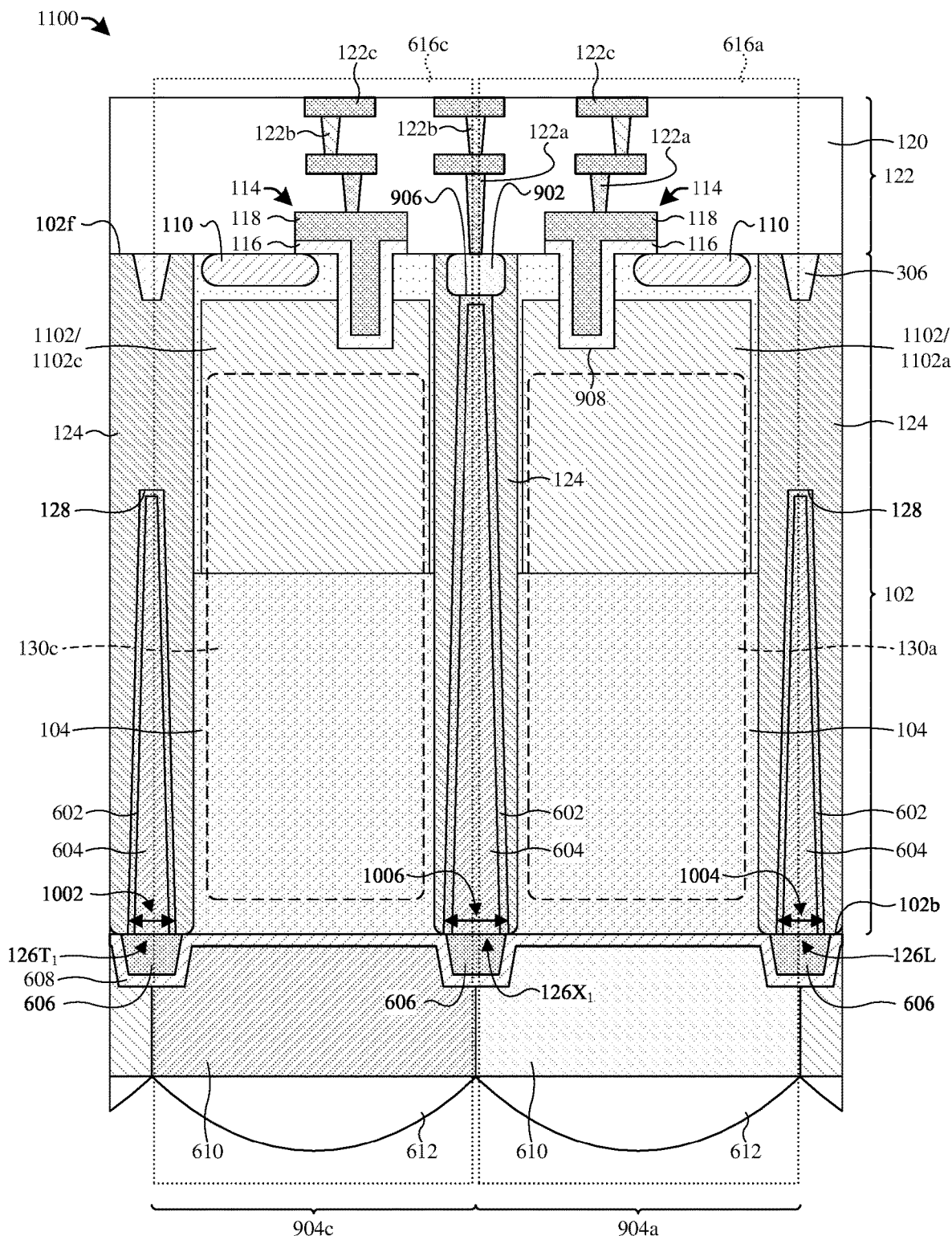
FIG. 11 illustrates a cross-sectional view of some other embodiments of the image sensor of FIGS. 9A-9D.

FIG. 11 illustrates a cross-sectional view 1100 of some other embodiments of the image sensor of FIGS. 9A-9D.

As shown in the cross-sectional view 1100 of FIG. 11, in some embodiments, the doped well 124 may extend vertically from the front side 102f of the substrate 102 to the back side 102b of the substrate 102.

Also shown in the cross-sectional view 1100 of FIG. 11, in some embodiments, a plurality of doped regions 1102 are disposed in the substrate 102. In further embodiments, the plurality of doped regions 1102 are disposed in the pixel regions of the plurality of pixel sensor units 616a-616d, respectively. For example, a first doped region 1102a of the plurality of doped regions 1102 is disposed in the first pixel region 902a of the substrate 102, a second doped region (not shown) of the plurality of doped regions 1102 is disposed in the second pixel region 902b of the substrate 102, a third doped region 1102c of the plurality of doped regions 1102 is disposed in the third pixel region 902c of the substrate 102, and a fourth doped region (not shown) of the plurality of doped regions 1102 is disposed in the third pixel region 902c of the substrate 102. In some embodiments, the plurality of doped regions 1102 are laterally spaced from the doped well 124 and/or the DTI structure 126.

The plurality of doped regions 1102 are regions of the substrate 102 having the second doping type (e.g., n-type/p-type). In some embodiments, the first doped region 104 has a greater concentration of second doping type dopants (e.g., n-type dopants (such as phosphorus (P), arsenic (As), antimony (Sb), etc.) or p-type dopants (such as boron (B), aluminum (Al), gallium (Ga), etc.)) than the plurality of doped regions 1102. In other embodiments, the first doped region 104 has a lower concentration of the second doping type dopants than the plurality of doped regions 1102.

Figure 12:
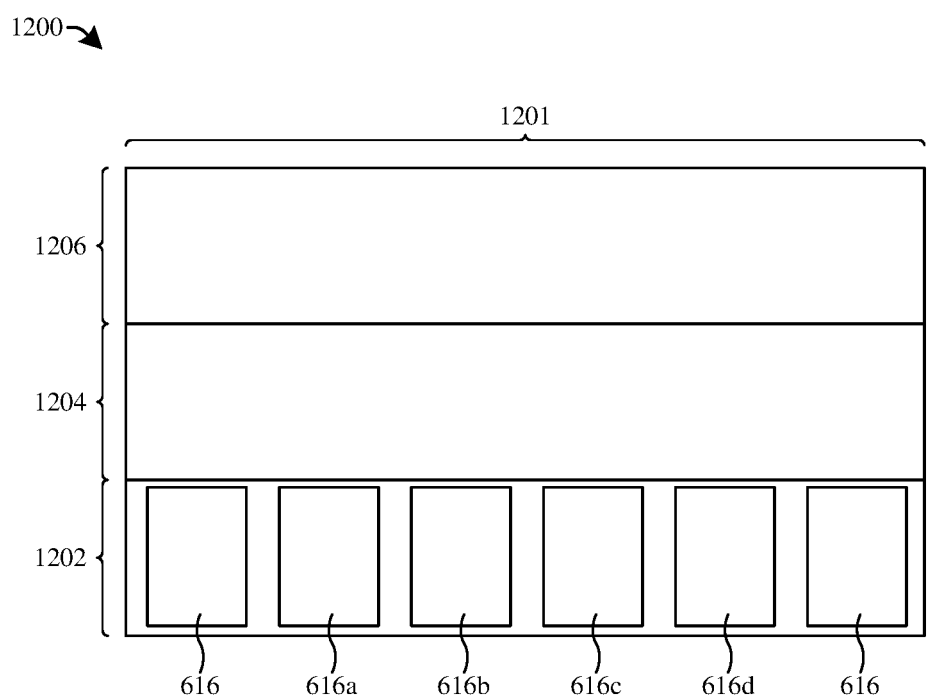
FIG. 12 illustrates a block diagram of some embodiments of an integrated chip (IC) comprising the image sensor of FIGS. 9A-9D.

FIG. 12 illustrates a block diagram 1200 of some embodiments of an integrated chip (IC) comprising the image sensor of FIGS. 9A-9D.

As shown in the block diagram 1200 of FIG. 12, the IC 1201 comprises a first chip 1202, a second chip 1204, and a third chip 1206. In some embodiments, the first chip 1202 comprises the image sensor of the present disclosure. For example, in some embodiments, the first chip 1202 comprises the plurality of pixel sensor units 616a-616d. The first chip 1202, the second chip 1204, and the third chip 1206 are bonded together (e.g., via one or more bonding structures). The first chip 1202, the second chip 1204, and the third chip 1206 are vertically stacked and electrically coupled together (e.g., via one or more conductive pads). In such embodiments, the image sensor may be referred to as a three (3) chip image sensor (e.g., 3-chip CIS). While the block diagram 1200 of FIG. 12 illustrates the IC 1201 comprising three (3) chips that are bonded together, it will be appreciated that the IC 1201 may comprise any number of chips bonded together (e.g., 2 chips, 3 chips, 4 chips, 5 chips, etc.). It will also be appreciated that, in some embodiments, the IC may only comprise the first chip 1202 (e.g., 1-chip CIS).

FIGS. 13-26 illustrate a series of cross-sectional views 1300-2600 of some embodiments of a method for forming an image sensor having an improved structure for small pixel designs.

Figure 13:
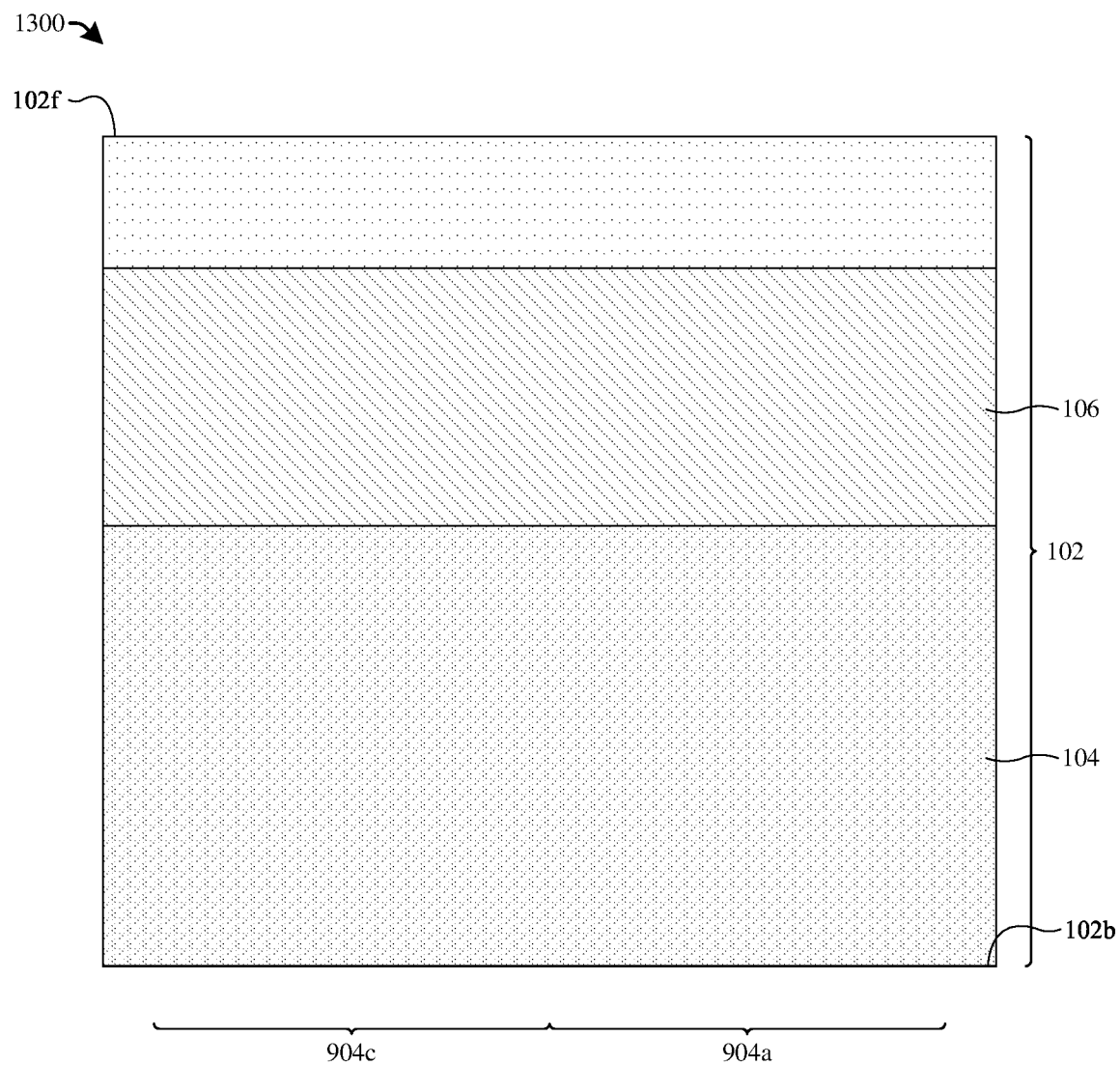
FIGS. 13-26 illustrate a series of cross-sectional views of some embodiments of a method for forming an image sensor having an improved structure for small pixel designs.

As shown in the cross-sectional view 1300 of FIG. 13, a first doped region 104 is formed in a substrate 102. The substrate 102 comprises a plurality of pixel regions 904a-904d. The first doped region 104 is also formed in the plurality of pixel regions 904a-904d. The first doped region 104 is a region of the substrate 102 having a second doping type (e.g., n-type/p-type).

In some embodiments, the first doped region 104 is formed via a blanket doping process that implants second doping type dopants (e.g., n-type dopants (such as phosphorus (P), arsenic (As), antimony (Sb), etc.) or p-type dopants (such as boron (B), aluminum (Al), gallium (Ga), etc.)) into the substrate 102. The blanket doping process does not utilize a masking layer (e.g., positive/negative photoresists, hardmask, etc.) to implant the second doping type dopants into the plurality of pixel regions 904a-904d of the substrate 102. In some embodiments, the blanket doping process is or comprises, for example, a blanket ion implantation process, a blanket diffusion process, some other blanket doping process, or a combination of the foregoing. It will be appreciated that a blanket doping process is different than a doping process that utilizes a masking layer to selectively implant the second doping type dopants into the plurality of pixel regions 904a-904d of the substrate 102. It will also be appreciated that, in other embodiments, the first doped region 104 may be formed by a doping process that utilizes a masking layer to selectively implant the second doping type dopants into the plurality of pixel regions 904a-904d of the substrate 102.

Also shown in the cross-sectional view 1300 of FIG. 13, a second doped region 106 is formed in a substrate 102. The second doped region 106 is formed over the first doped region 104. The second doped region 106 is also formed in the plurality of pixel regions 904a-904d. The second doped region 106 is a region of the substrate 102 having the second doping type. In some embodiments, the first doped region 104 has a greater concentration of the second doping type dopants than the second doped region 106. In other embodiments, the first doped region 104 has a lower concentration of the second doping type dopants than the second doped region 106.

In some embodiments, the second doped region 106 is formed via a blanket doping process that implants second doping type dopants into the substrate 102. The blanket doping process does not utilize a masking layer (e.g., positive/negative photoresists, hardmask, etc.) to implant the second doping type dopant into the plurality of pixel regions 904a-904d of the substrate 102. In some embodiments, the blanket doping process is or comprises, for example, a blanket ion implantation process, a blanket diffusion process, some other blanket doping process, or a combination of the foregoing. It will be appreciated that a blanket doping process is different than a doping process that utilizes a masking layer to selectively implant the second doping type dopants into the plurality of pixel regions 904a-904d of the substrate 102. It will also be appreciated that, in other embodiments, the second doped region 106 may be formed by a doping process that utilizes a masking layer to selectively implant the second doping type dopants into the plurality of pixel regions 904a-904d of the substrate 102.

Figure 14:
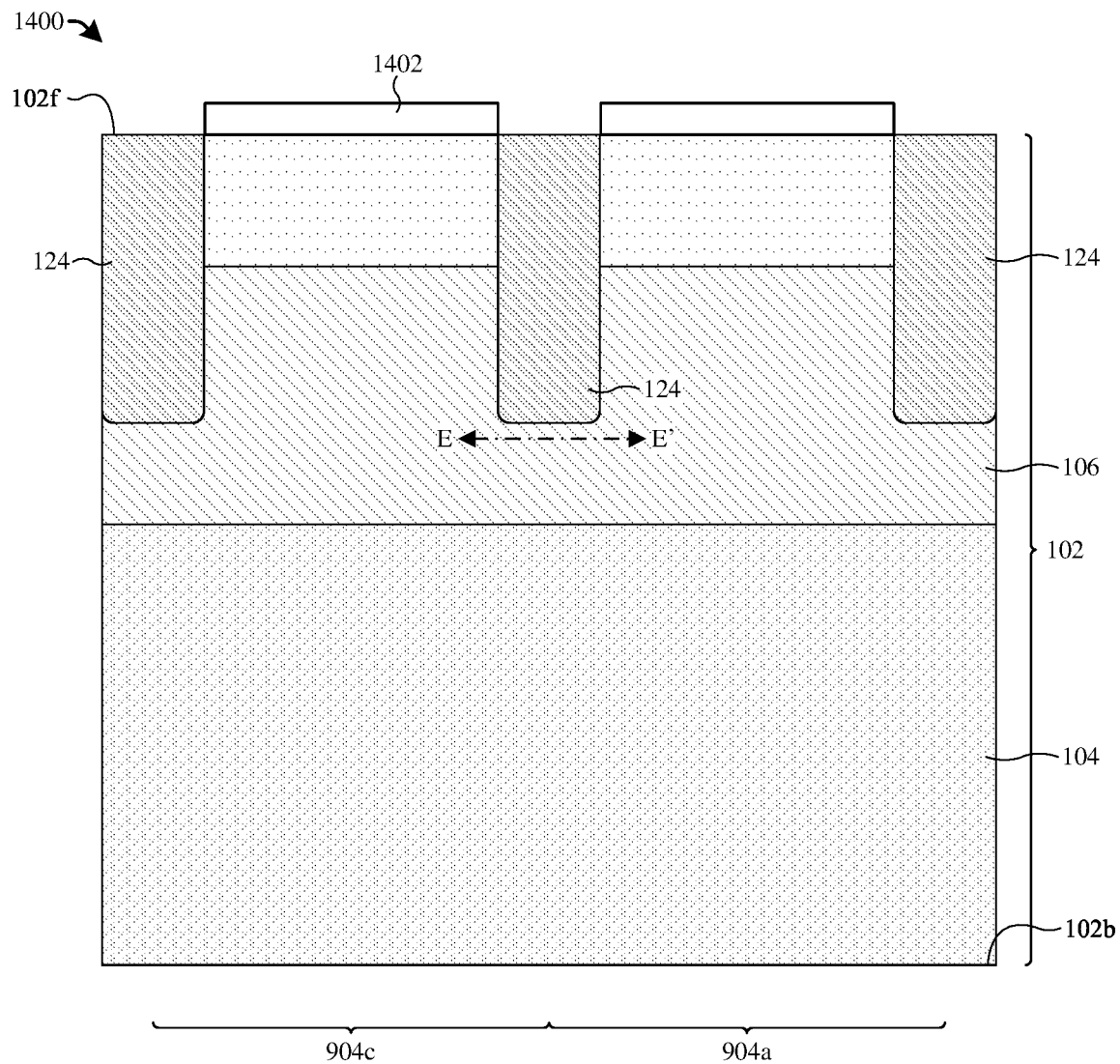

As shown in the cross-sectional view 1400 of FIG. 14, a doped well 124 is formed in the substrate 102. The doped well 124 is a portion of the substrate 102 having the first doping type. The doped well 124 is formed extending vertically into the substrate 102. The doped well 124 is formed extending vertically into the second doped region 106. The doped well 124 is formed extending laterally through the substrate 102, such that the doped well laterally surrounds the plurality of pixel regions 904a-904d. In some embodiments, the doped well 124 is formed extending partially through the substrate 102. In some embodiments, the doped well 124 is formed extending vertically into the second doped region 106 from the front side 102f of the substrate 102 and formed vertically spaced from the back side 102b of the substrate 102.

In some embodiments, the doped well 124 may be formed by a doping process (e.g., via ion implantation, diffusion, etc.) that utilizes a patterned masking layer 1402 (e.g., positive/negative photoresist, a hardmask, etc.) on the front side 102f of the substrate 102 to selectively implant first doping type dopants (e.g., p-type dopants) into the substrate 102. In some embodiments, a process for forming the patterned masking layer 1402 comprises depositing a masking layer (not shown) on the front side 102f of the substrate 102. The masking layer may be deposited by, for example, chemical vapor deposition (CVD), physical vapor deposition (PVD), atomic layer deposition (ALD), a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer 1402 over the front side 102f of the substrate 102. With the patterned masking layer 1402 in place over the front side 102f of the substrate 102, the doping process is performed on the substrate 102, thereby forming the doped well 124. In some embodiments, the doping process may be, for example, an ion implantation process, a diffusion process, some other doping process, or a combination of the foregoing. Subsequently, in some embodiments, the patterned masking layer 1402 is stripped away.

In some embodiments, because the doped well 124 is formed extending partially through the substrate 102 (e.g., not fully through the substrate 102), the patterned masking layer 1402 may be relatively short (e.g., have a relatively small thickness). As such, the dimensions of the doped well 124 may be scaled down in comparison to a typical CIS. Accordingly, the image sensor of the present disclosure may have more scaled down dimensions than the typical CIS.

Because the second doped region 106 is formed via a blanket doping process, rather than a doping process that utilized a lithography process, the doped well 124 may be formed in contact with the second doped region 106. Thus, the size of the plurality of pixel regions 904a-904d may be reduced in comparison to a typical CIS. Accordingly, the image sensor of the present disclosure may have more scaled down dimensions than the typical CIS.

Further, FIG. 14 comprises a line E-E' that extends laterally through the second doped region 106 and is disposed below (e.g., directly below) a portion of the doped well 124. In some embodiments, a doping concentration of the second doping type dopants of the second doped region 106 varies by no more than ten percent (10%) from E to E' along line E-E'. In some embodiments, the doping concentration of the second doping type dopants of the second doped region 106 may vary by no more than ten percent (10%) from E to E' along line E-E' due to the second doped region 106 being formed by the blanket doping process. In further embodiments, it may be an indication that the second doped region 106 was formed by the blanket doping process if the doping concentration of the second doping type dopants of the second doped region 106 varies by no more than ten percent (10%) from E to E' along line E-E'. In other words, it may be an indication that the second doped region 106 was formed by some other formation process (e.g., a doping process that utilized a lithography process) if the doping concentration of the second doping type dopants of the second doped region 106 varies by more than ten percent (10%) from E to E' along line E-E'.

In some embodiments, the doping concentration of the second doping type dopants of the second doped region 106 varies by no more than six percent (6%) from E to E' along line E-E'. In some embodiments, the doping concentration of the second doping type dopants of the second doped region 106 may vary by no more than six percent (6%) from E to E' along line E-E' due to the second doped region 106 being formed by the blanket doping process. In further embodiments, it may be an indication that the second doped region 106 was formed by the blanket doping process if the doping concentration of the second doping type dopants of the second doped region 106 varies by no more than six percent (6%) from E to E' along line E-E'. In other words, it may be an indication that the second doped region 106 was formed by some other formation process (e.g., a doping process that utilized a lithography process) if the doping concentration of the second doping type dopants of the second doped region 106 varies by more than six percent (6%) from E to E' along line E-E'.

Figure 15:
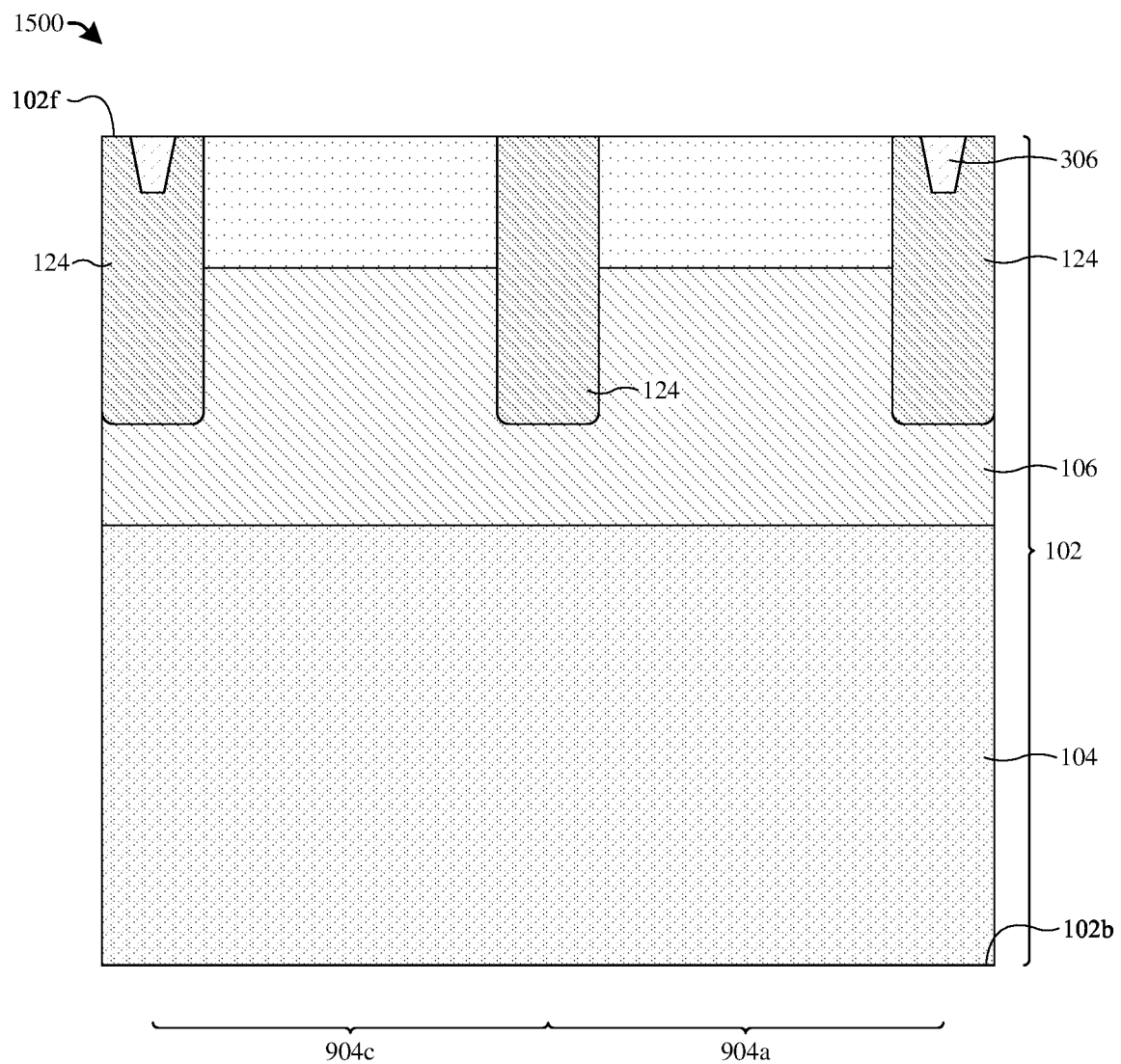

As shown in the cross-sectional view 1500 of FIG. 15, an STI structure 306 is formed in the substrate 102. The STI structure 306 is formed within the doped well 124. The STI structure 306 may be formed with a footprint that is disposed within a footprint of the doped well 124.

In some embodiments, a process for forming the STI structure 306 comprises forming a patterned masking layer (not shown) (e.g., negative/positive photoresist, a hardmask, etc.) over the front side 102f of the substrate 102. With the patterned masking layer in place over the front side 102f of the substrate 102, an etching process is then performed on the substrate 102. The etching process removes unmasked portions of the substrate, thereby forming a trench in the substrate 102. The etching process may be or comprise, for example, a wet etching process, a dry etching process, a reactive ion etching (RIE) process, some other etching process, or a combination of the foregoing. Subsequently, in some embodiments, the patterned masking layer is then stripped away. Thereafter, the trench is filled with one or more dielectric materials, thereby forming the STI structure 306 in the substrate 102.

Figure 16:
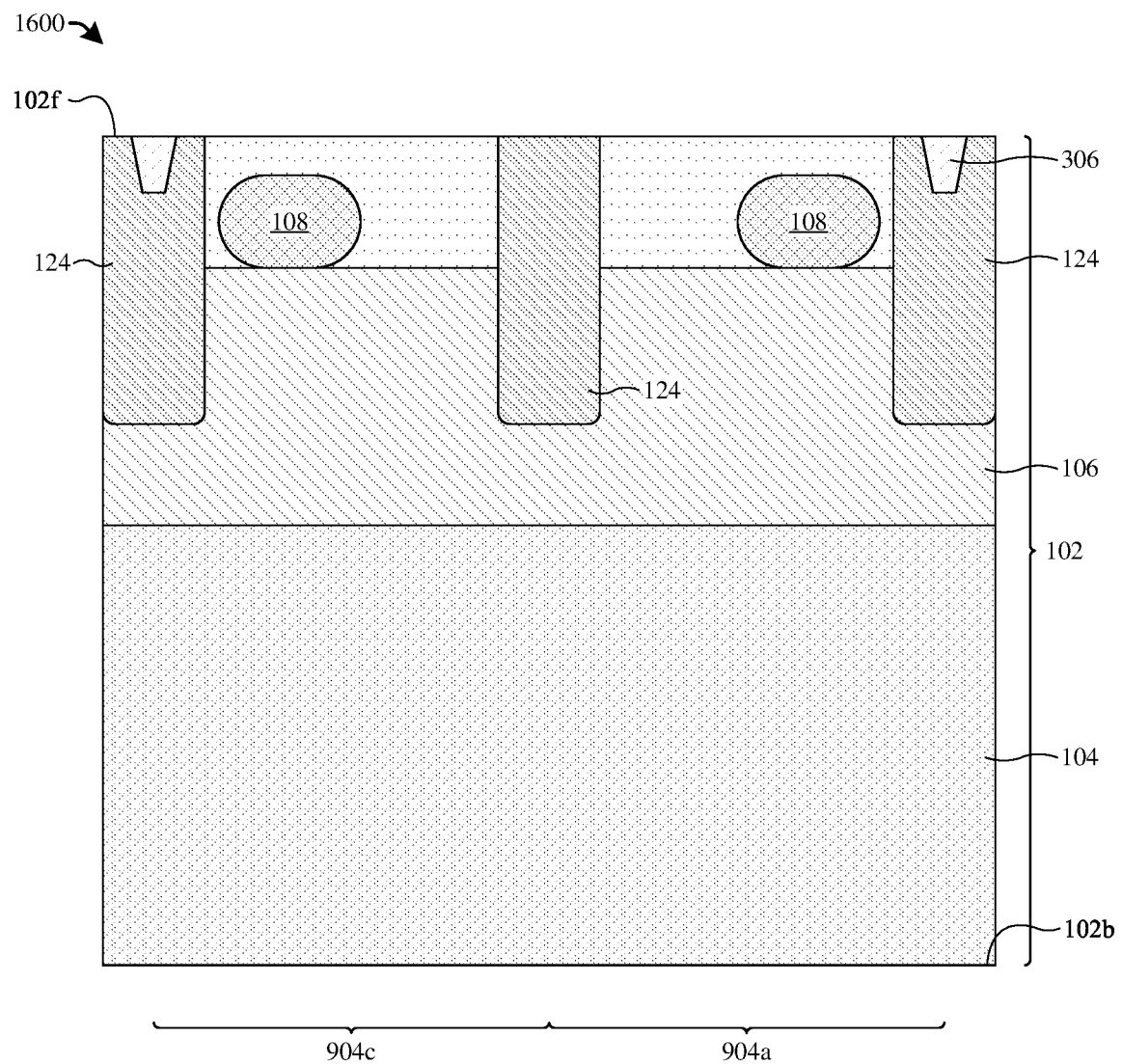

As shown in the cross-sectional view 1600 of FIG. 16, a plurality of third doped regions (see, e.g., the third doped region 108 described herein) are formed in the plurality of pixel regions 904a-904d, respectively. The plurality of third doped regions are formed over the second doped region 106. The plurality of third doped regions are regions of the substrate 102 having the second doping type. In some embodiments, the plurality of third doped regions may have a greater concentration of the second doping type dopants than the second doped region 106. In other embodiments, the plurality of third doped regions have a lower concentration of the second doping type dopants than the second doped region 106.

In some embodiments, a process for forming the plurality of third doped regions comprises forming a patterned masking layer (not shown) (e.g., negative/positive photoresist, a hardmask, etc.) over the front side 102f of the substrate 102. Thereafter, with the patterned masking layer in place, a doping process (e.g., an ion implantation process, a diffusion process, etc.) is performed on the substrate to selectively implant second doping type dopants into the substrate 102 according to the patterned masking layer, thereby forming the plurality of third doped regions. Subsequently, in some embodiments, the patterned masking layer is stripped away.

Figure 17:
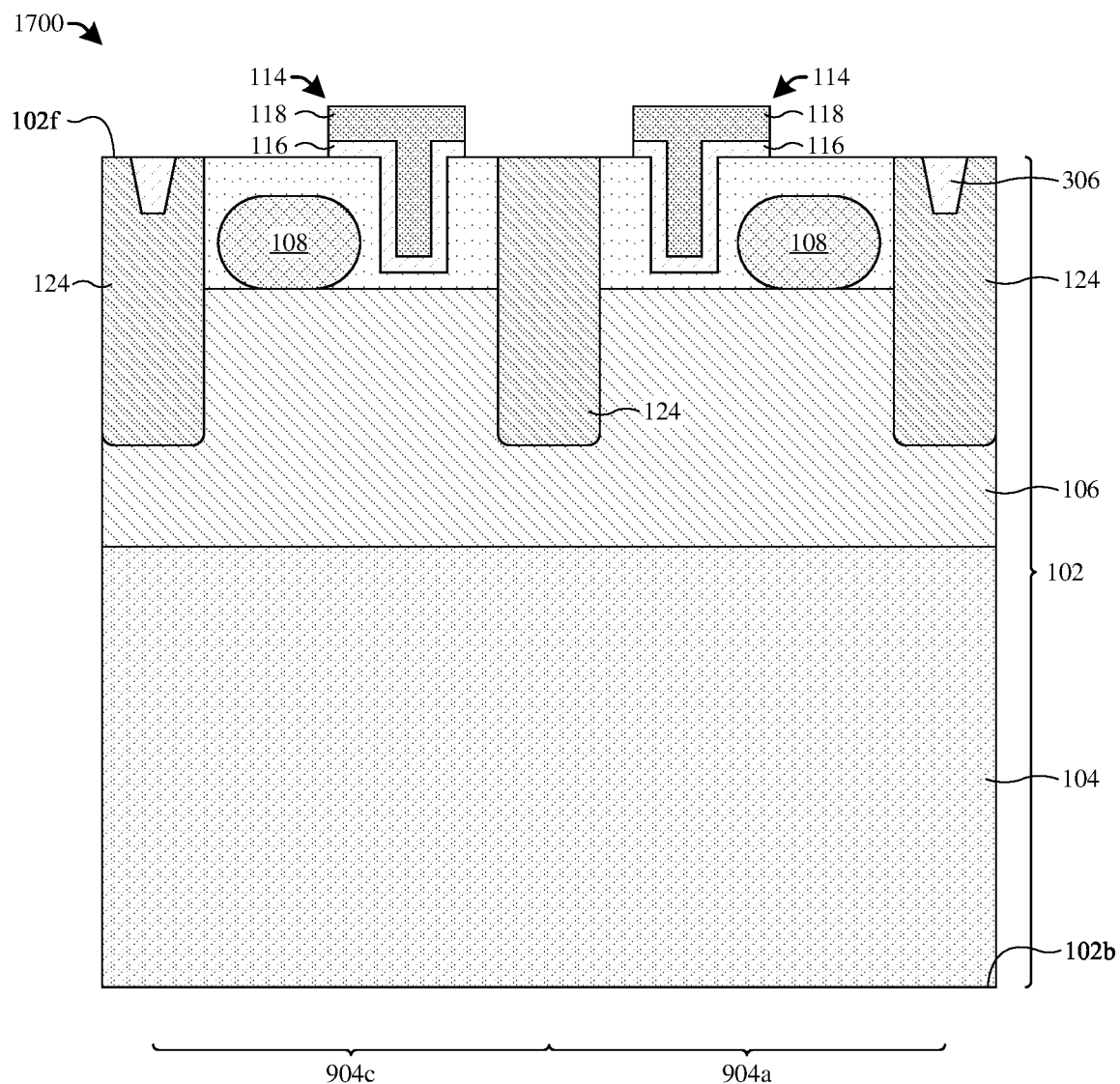

As shown in the cross-sectional view 1700 of FIG. 17, a plurality of transfer gates (see, e.g., the transfer gate 114 described herein) are formed over/on the front side 102f of the substrate 102. The plurality of transfer gates are formed overlying, at least partially, the plurality of pixel regions 904a-904d, respectively. In some embodiments, each of the plurality of transfer gates are formed between two portions of the doped well 124. Each of the plurality of transfer gates are formed with a gate dielectric structure 116 and a gate electrode structure 118.

In some embodiments, a process for forming the plurality of transfer gates comprises forming a first patterned masking layer (not shown) (e.g., negative/positive photoresist, a hardmask, etc.) over the front side 102f of the substrate 102. With the first patterned masking layer in place over the front side 102f of the substrate 102, an etching process is then performed on the substrate 102. The etching process removes unmasked portions of the substrate 102, thereby forming a plurality of vertical gate trenches in the substrate 102. The etching process may be or comprise, for example, a wet etching process, a dry etching process, a RIE process, some other etching process, or a combination of the foregoing. Subsequently, in some embodiments, the patterned masking layer is then stripped away.

Thereafter, a gate dielectric layer (not shown) is formed over/on the front side 102f of the substrate 102 and lining the plurality of vertical gate trenches. In some embodiments, the gate dielectric layer is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. A gate electrode layer (not shown) is then formed on the gate dielectric layer and in the plurality of vertical gate trenches. In some embodiments, the gate electrode layer is or comprises, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing.

Thereafter, a second patterned masking layer (not shown) (e.g., negative/positive photoresist, a hardmask, etc.) is formed over the gate electrode layer. With the second patterned masking layer in place, an etching process is performed on the gate electrode layer and the gate dielectric layer. The etching process removes unmasked portions of the gate electrode layer, thereby forming the gate electrode structures (see, e.g., the gate electrode structure 118 described herein). The etching process also removes unmasked portions of the gate dielectric layer, thereby forming the gate dielectric structures (see, e.g., the gate dielectric structure 116 described herein). In some embodiments, the etching process may be or comprise, for example, a wet etching process, a dry etching process, a RIE process, some other etching process, or a combination of the foregoing. Subsequently, in some embodiments, the second patterned masking layer is stripped away.

Figure 18:
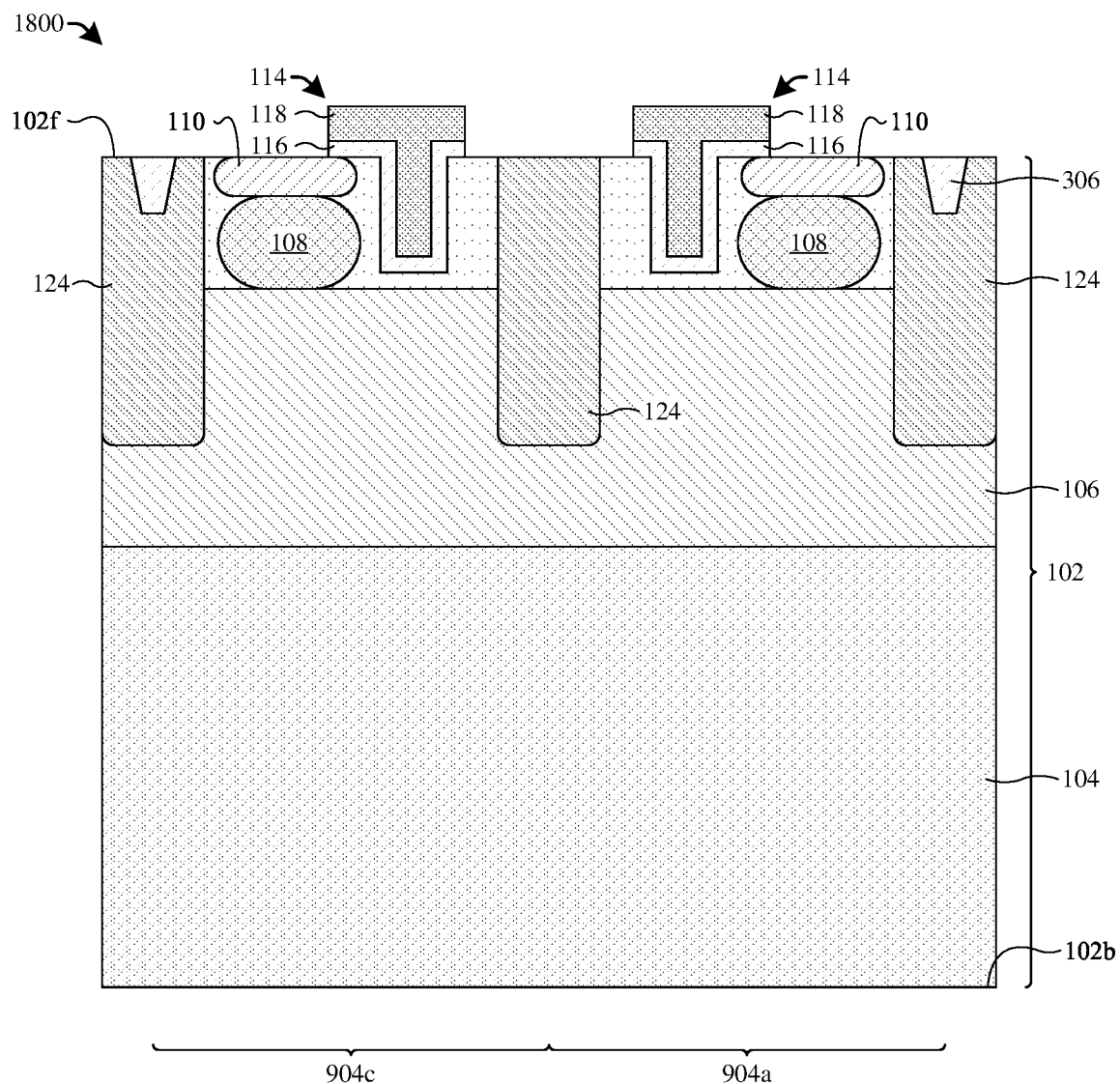

As shown in the cross-sectional view 1800 of FIG. 18, a plurality of fourth doped regions (see, e.g., the fourth doped region 110 described herein) are formed in the plurality of pixel regions 904a-904d, respectively. The plurality of fourth doped regions are formed over the plurality of third doped regions. The plurality of fourth doped regions are regions of the substrate 102 having the first doping type. In some embodiments, the plurality of fourth doped regions may be formed by a doping process (e.g., via (angled) ion implantation, diffusion, etc.) that utilizes a patterned masking layer (not shown) (e.g., positive/negative photoresist, a hardmask, etc.) over the front side 102f of the substrate 102 (and over the plurality of transfer gates) to selectively implant first doping type dopants into the substrate 102. In some embodiments, the plurality of transfer gates are utilized, at least partially, as the patterned masking layer. Subsequently, in some embodiments, the patterned masking layer is stripped away.

Figure 19:
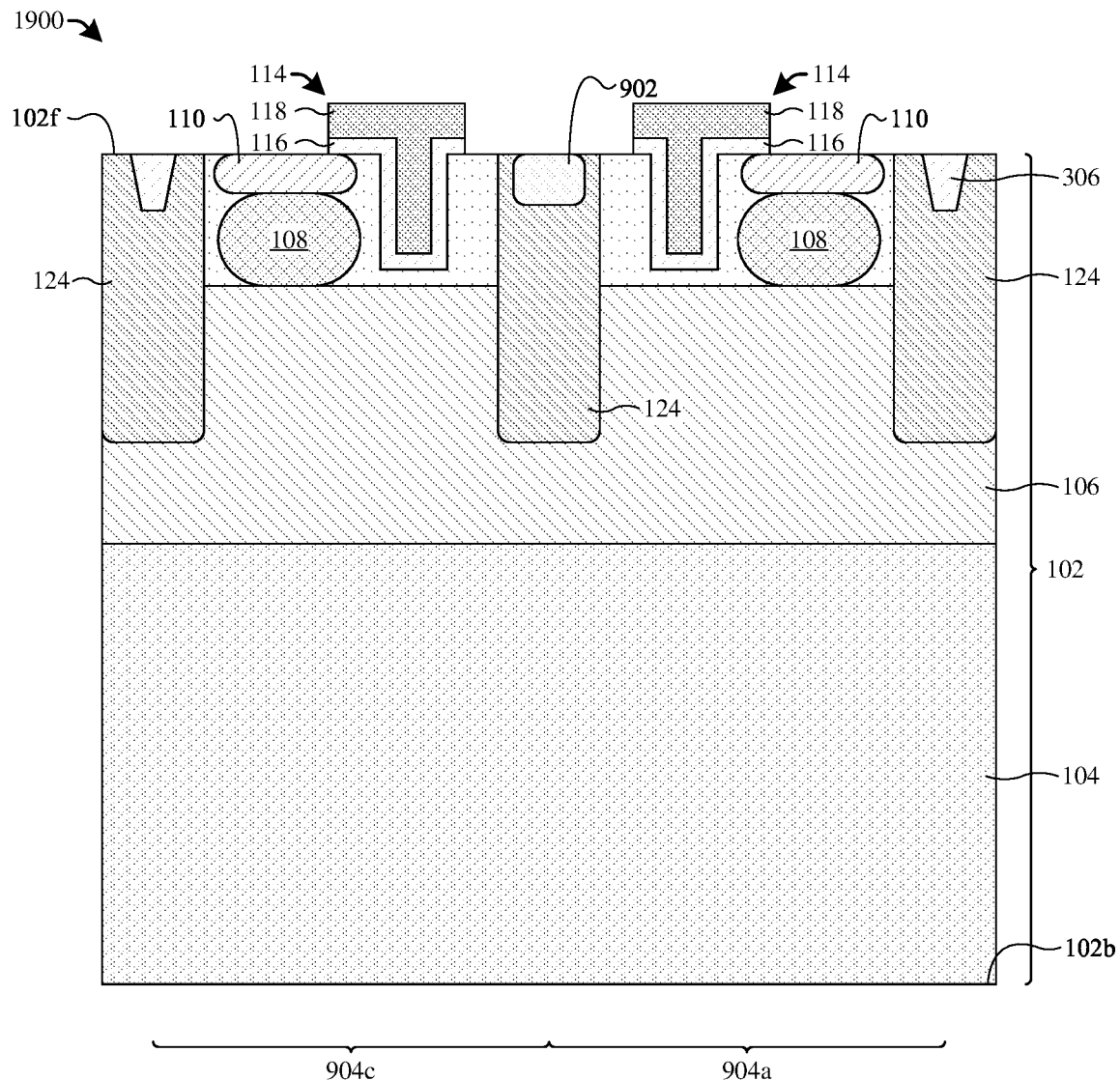

As shown in the cross-sectional view 1900 of FIG. 19, a common floating diffusion node 902 is formed in the substrate 102. In some embodiments, the common floating diffusion node 902 is formed in the doped well 124. The common floating diffusion node 902 is a region of the substrate 102 having the second doping type. In some embodiments, the common floating diffusion node 902 may be formed by a doping process (e.g., via ion implantation, diffusion, etc.) that utilizes a patterned masking layer (not shown) (e.g., positive/negative photoresist, a hardmask, etc.) over the front side 102f of the substrate 102 (and over the plurality of transfer gates) to selectively implant second doping type dopants into the substrate 102. In some embodiments, the plurality of transfer gates are utilized, at least partially, as the patterned masking layer. Subsequently, in some embodiments, the patterned masking layer is stripped away.

Figure 20:
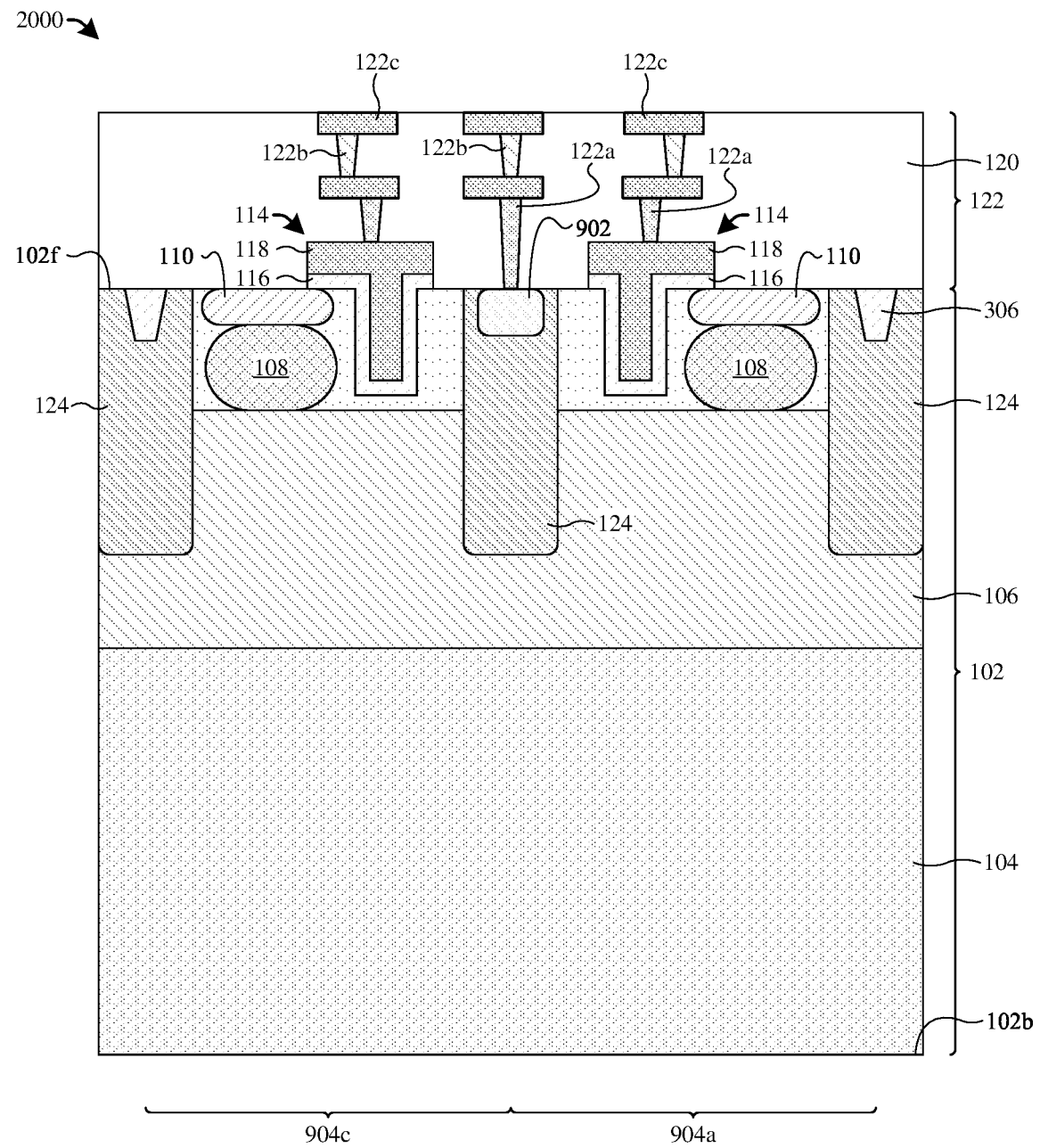

As shown in the cross-sectional view 2000 of FIG. 20, an ILD structure 120 is formed over the front side 102f of the substrate 102 and over the plurality of transfer gates. Also shown in the cross-sectional view 2000 of FIG. 20, an interconnect structure 122 is formed in the ILD structure 120 and over the front side 102f of the substrate 102. In some embodiments, the interconnect structure 122 comprises a plurality of conductive contacts 122a, a plurality of conductive vias 122b, and a plurality of conductive wires 122c.

In some embodiments, a process for forming the ILD structure 120 and the interconnect structure 122 comprises forming a first ILD layer over the front side 102f of the substrate 102. Thereafter, contact openings are formed in the first ILD layer. A conductive material (e.g., tungsten (W)) is then formed on the first ILD layer and in the contact openings. Thereafter, a planarization process (e.g., chemical-mechanical planarization (CMP)) is performed on the conductive material to form the plurality of conductive contacts 122a in the first ILD layer. A second ILD layer is then formed over the first ILD layer and the plurality of conductive contacts 122a. A plurality of trenches are then formed in the second ILD layer. A conductive material (e.g., copper (Cu)) is formed on the second ILD layer and in the trenches. Thereafter, a planarization process (e.g., CMP) is performed into the conductive material to form a first group of conductive wires of the plurality of conductive wires 122c (e.g., the conductive wires of a first layer of conductive wires (e.g., metal layer 1)).

Thereafter, the plurality of conductive vias 122b and the remaining conductive wires of the plurality of conductive wires 122c of the interconnect structure 122 may be formed by repeating a damascene process (e.g., a single damascene process or a dual damascene process) until a predefined number of conductive vias and conductive wires are formed in the ILD structure 120. The damascene process may be performed by depositing a subsequent ILD layer over the second ILD layer and the first group of conductive wires of the plurality of conductive wires 122c, etching the subsequent ILD layer to form one or more via holes and/or one or more trenches in the subsequent ILD layer, and filling the one or more via holes and/or the one or more trenches with a conductive material (e.g., copper (Cu)). Thereafter, a planarization process (e.g., CMP) is performed on the conductive material, thereby forming a second group of conductive wires of the plurality of conductive wires 122c (e.g., the conductive wires of a second layer of conductive wires (e.g., metal layer 2)) and/or the conductive vias of the plurality of conductive vias 122b that extend vertically between the first group and the second group of conductive wires. This damascene process is repeated until each of the plurality of conductive vias 122b and each of the plurality of conductive wires 122c of the interconnect structure 122 are formed in the ILD structure 120. The ILD layers may be formed by, for example, CVD, PVD, ALD, some other deposition process, or a combination of the foregoing. The conductive material(s) (e.g., tungsten (W), copper (Cu), etc.) may be formed using a deposition process (e.g., CVD, PVD, sputtering, etc.) and/or a plating process (e.g., electrochemical plating, electroless plating, etc.).

Figure 21:
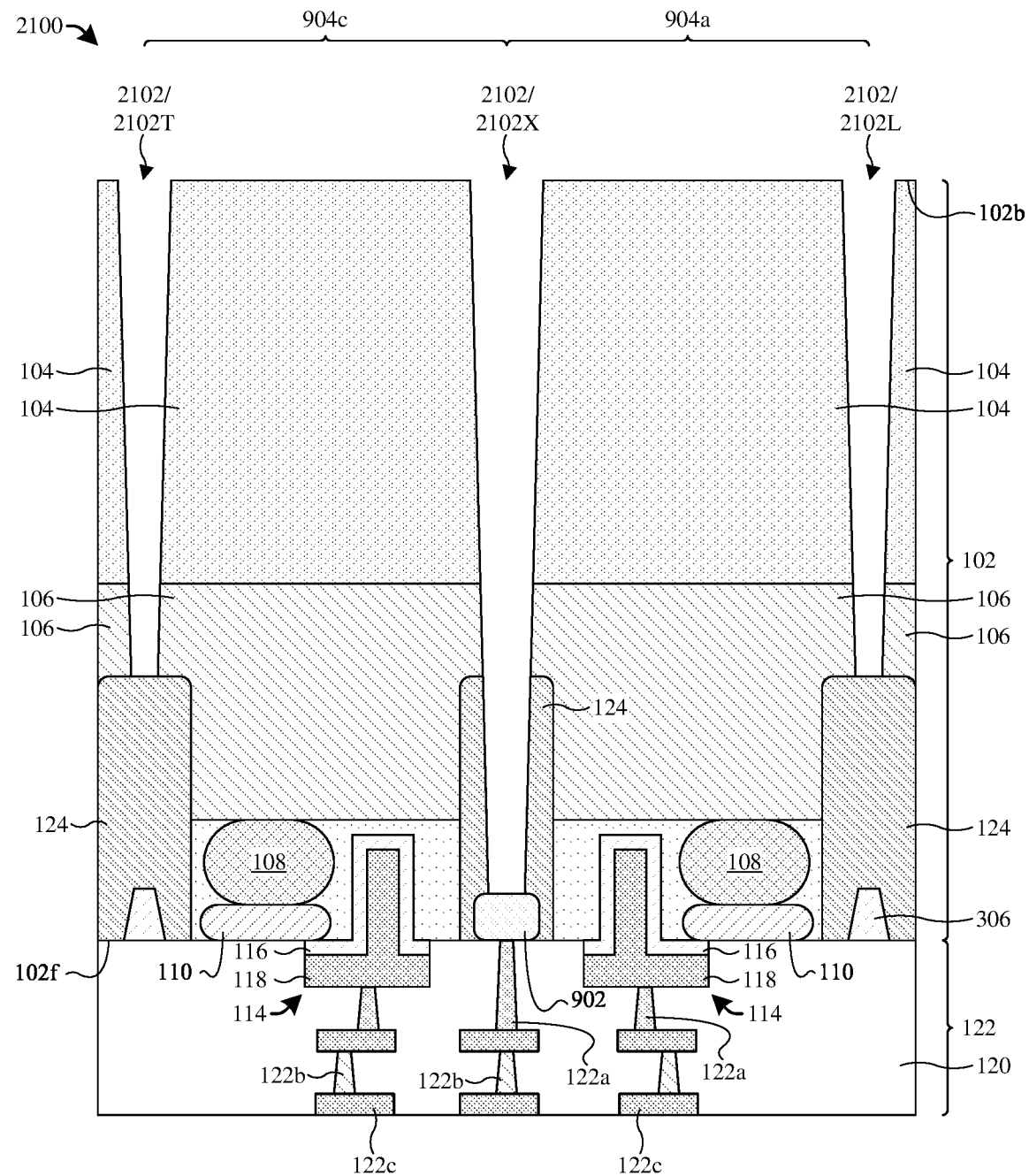

As shown in the cross-sectional view 2100 of FIG. 21, a trench 2102 is formed in the substrate 102. The trench 2102 extends into the substrate 102 from the back side 102b of the substrate 102. The trench 2102 is formed extending laterally through the substrate 102, such that the trench 2102 laterally surrounds the plurality of pixel regions 904a-904d. The trench 2102 is formed with a footprint that is disposed within the footprint of the doped well 124.

The trench 2102 may extend partially through the substrate 102 (e.g., not fully through the substrate 102). The trench 2102 extends vertically through the first doped region 104 and vertically into the second doped region 106. In such embodiments, the trench 2102 exposes portions of the first doped region 104 and portions of the second doped region 106. In further such embodiments, the portions of the first doped region 104 and the portions of the second doped region 106 at least partially define surfaces (e.g., sidewalls) of the trench 2102. In some embodiments, the trench 2102 extends vertically partially into the second doped region 106, such that a portion of the second doped region 106 is disposed vertically between the trench 2102 and the front side 102f of the substrate 102. In other embodiments, the trench 2102 may extend vertically through both the first doped region 104 and the second doped region 106, such that some other portion of the substrate 102 that is disposed vertically between the second doped region 106 and the front side 102f of the substrate 102 is disposed vertically between the trench 2102 and the front side 102f of the substrate 102. In yet other embodiments, the trench 2102 may extend from the back side 102b of the substrate 102 to the front side 102f of the substrate 102 (e.g., extend fully through the substrate 102). It will be appreciated that, in some embodiments, the trench 2102 may be formed to extend into the substrate from the front side 102f of the substrate 102, rather than the back side 102b of the substrate 102. In some embodiments, the trench 2102 may have angled sidewalls, as illustrated in the cross-sectional view 100 of FIG. 1. In other embodiments, the sidewalls of the trench 2102 may be substantially straight (e.g., vertical).

In some embodiments, the second doped region 106 continuously extends laterally between opposite inner sidewalls of the trench 2102. In some embodiments, the second doped region 106 continuously extends laterally between the opposite inner sides of the doped well 124 and continuously extends laterally between the opposite inner sidewalls of the trench 2102. In some embodiments, the first doped region 104 continuously extends laterally between the opposite inner sidewalls of the trench 2102.

In some embodiments, a layout of the trench 2102 has a grid-like shape. As such, the footprint of the trench 2102 has the grid-like shape. In such embodiments, the grid-like shaped footprint of the trench 2102 is disposed within a grid-like shaped footprint of the doped well 124. The grid-like shape of the trench 2102 comprises longitudinal portions 2102L of the trench 2102 and transverse portions 2102T of the trench 2102. The longitudinal portions 2102L of the trench 2102 extend in parallel with one another in a first lateral direction. The transverse portions 2102T of the trench 2102 extend in parallel with one another in a second lateral direction perpendicular to the first lateral direction. The longitudinal portions 2102L of the trench 2102 and the transverse portions 2102T of the trench 2102 intersect one another. The regions of the trench 2102 where the longitudinal portions 2102L of the trench 2102 intersect the transverse portions 2102T of the trench 2102 may be referred to as intersection portions 2102X of the trench 2102. The intersection portions 2102X of the trench 2102 are formed with a greater depth (e.g., vertically extend deeper into the substrate 102) than the longitudinal portions 2102L of the trench 2102 and the transverse portions 2102T of the trench 2102.

In some embodiments, the trench 2102 extends vertically into the doped well 124. In further embodiments, the intersection portions 2102X of the trench 2102 may extend into the doped well 124, while the transverse portions 2102T of the trench 2102 and the longitudinal portions 2102L of the trench 2102 are vertically spaced from the doped well 124. In other embodiments, the intersection portions 2102X of the trench 2102 may extend into the doped well 124, while the transverse portions 2102T of the trench 2102 and the longitudinal portions 2102L of the trench 2102 (directly) contact the doped well 124 without extending into the doped well 124. In yet other embodiments, the intersection portions 2102X of the trench 2102, the transverse portions 2102T of the trench 2102, and the longitudinal portions 2102L of the trench 2102 may extend vertically into the doped well 124. The portions of the trench 2102 that extend into the doped well 124 expose portions of the doped well 124. In some embodiments, the intersection portions 2102X of the trench 2102 may expose portions of a plurality of common floating diffusion nodes, respectively (see, e.g., the common floating diffusion node 902).

In some embodiments, a process for forming the trench 2102 comprises forming a patterned masking layer (not shown) (e.g., positive/negative photoresist, a hardmask, etc.) over the back side 102b of the substrate 102. In some embodiments, a process for forming the patterned masking layer comprises flipping (e.g., rotating 180 degrees) the structure illustrated in FIG. 20 so that the back side 102b of the substrate 102 is facing upward. Thereafter, a masking layer (not shown) is deposited on the back side 102b of the substrate 102. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer over the back side 102b of the substrate 102.

With the patterned masking layer in place over the back side 102b of the substrate 102, an etching process is then performed on the substrate 102. The etching process removes unmasked portions of the substrate 102, thereby forming the trench 2102 in the substrate 102. The etching process may be or comprise, for example, a wet etching process, a dry etching process, a RIE process, some other etching process, or a combination of the foregoing. Subsequently, in some embodiments, the patterned masking layer is stripped away.

Figure 22:
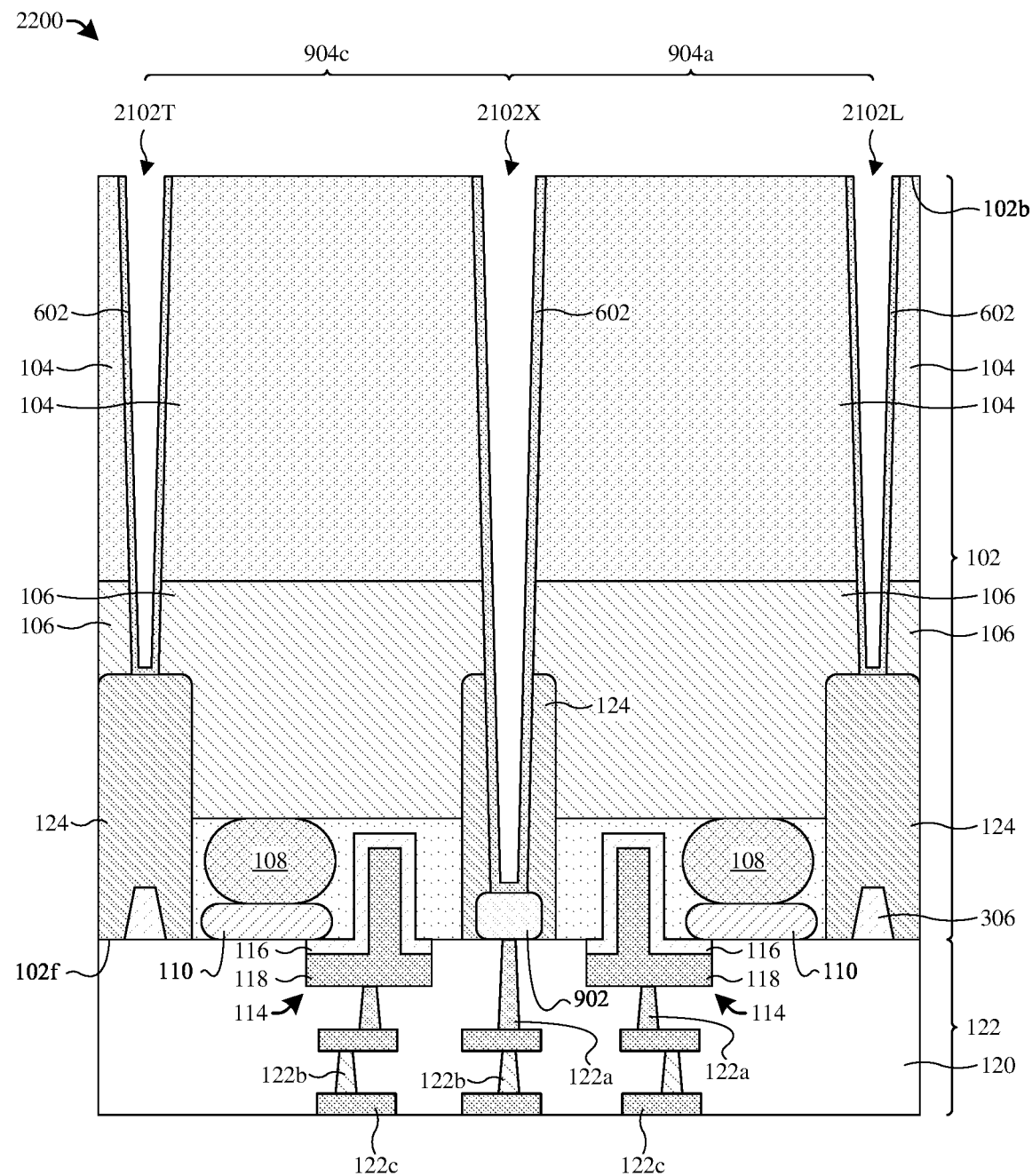

As shown in the cross-sectional view 2200 of FIG. 22, a dielectric liner structure 602 is formed lining surfaces of the trench 2102 (e.g., sidewalls of the trench 2102, lower surfaces of the trench 2102, etc.). In some embodiments, the dielectric liner structure 602 is formed contacting (e.g., directly contacting) the second doped region 106, as illustrated in the cross-sectional view 2200 of FIG. 22. In some embodiments, the dielectric liner structure 602 is formed contacting (e.g., directly contacting) the doped well 124, as illustrated in the cross-sectional view 2200 of FIG. 22. In some embodiments, the dielectric liner structure 602 is formed contacting (e.g., directly contacting) the first doped region 104. In some embodiments, the dielectric liner structure 602 is formed contacting (e.g., directly contacting) the common floating diffusion node 902. In some embodiments, the dielectric liner structure 602 is omitted.

In some embodiments, a process for forming the dielectric liner structure 602 comprises depositing a dielectric liner layer (not shown) on the back side 102b of the substrate 102 and along the surfaces of the trench 2102. The dielectric liner layer may be or comprise, for example, a high-k dielectric material (e.g., HfO, TaO, HfSiO, HfTaO, AlO, ZrO, etc.), an oxide (e.g., $SiO_2$), a nitride (e.g., SiN), an oxy-nitride (e.g., SiON), a carbide (e.g., silicon carbide (SiC)), some other dielectric material, or a combination of the foregoing. The dielectric liner layer may be deposited by, for example, CVD, PVD, ALD, some other deposition process, or a combination of the foregoing. Thereafter, an upper portion of the dielectric liner layer is removed, thereby leaving remaining portions in place as the dielectric liner structure 602. In some embodiments, the upper portion of the dielectric liner layer may be removed by, for example, a planarization process (e.g., chemical-mechanical planarization (CMP)), an etching process (e.g., wet etching, dry etching, etc.), some other removal process, or the like.

Figure 23:
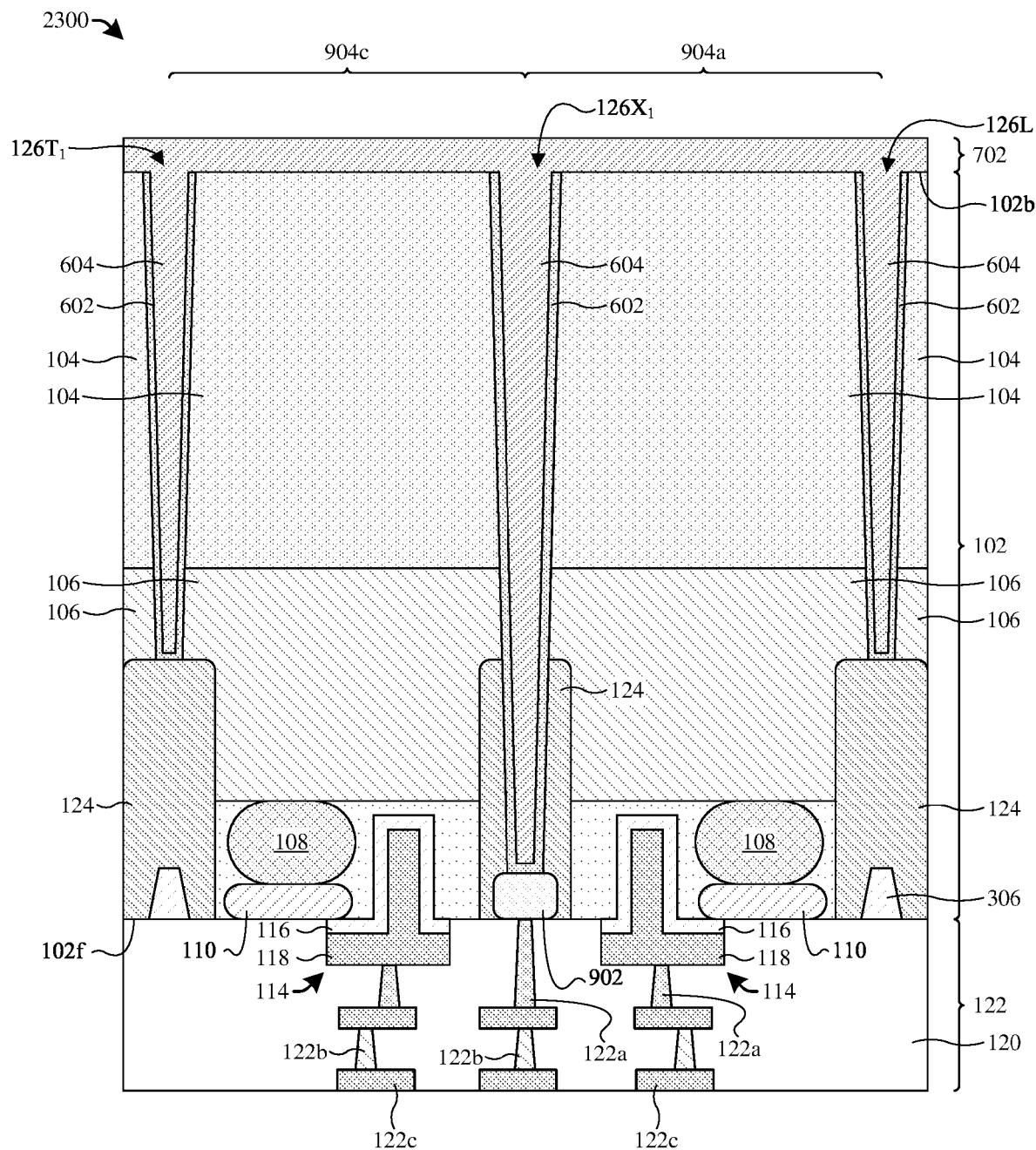

As shown in the cross-sectional view 2300 of FIG. 23, a dielectric filler structure 604 is formed in the trench 2102 (see, e.g., FIG. 22). In some embodiments, the dielectric filler structure 604 is also formed over the back side 102b of the substrate 102. In such embodiments, a portion 702 of the dielectric filler structure 604 is formed along the back side 102b of the substrate 102. In some embodiments, forming the dielectric filler structure 604 completes formation of a DTI structure 126 in the trench 2102. In other words, the DTI structure 126 is formed in the trench 2102, and forming the DTI structure 126 in the trench 2102 comprises forming the dielectric filler structure 604 in the trench 2102. Because the DTI structure 126 is formed in the trench 2102, it will be appreciated that the trench 2102 comprises features (e.g., structural features) that correspond to features of the DTI structure 126 described herein. For example, as described herein, the DTI structure 126 may have a dimension 1006. Thus, it will be appreciated that the trench 2102 may also have the dimension 1006 (or a substantially similar dimension as the dimension 1006). The DTI structure 126 comprises longitudinal portions 126L of the DTI structure 126, transverse portions 126T of the DTI structure 126, and a plurality of intersection portions 126X of the DTI structure 126.

Because the second doped region 106 is formed via a blanket doping process, rather than a doping process that utilized a lithography process, the DTI structure 126 may be formed in contact with the second doped region 106. Thus, the size of the plurality of pixel regions 904a-904d may be reduced in comparison to a typical CIS. Accordingly, the image sensor of the present disclosure may have more scaled down dimensions than the typical CIS.

Further, because the trench 2102 is formed with a footprint that is disposed within a footprint of the doped well 124, and because the DTI structure 126 is formed in the trench 2102, the DTI structure 126 is formed with a footprint that is disposed within the footprint of the doped well 124. Because the DTI structure 126 is formed with a footprint that is disposed within the footprint of the doped well 124, the size of the plurality of pixel regions 904a-904d may be reduced in comparison to the size of pixel regions of the typical CIS, while still having good electrical performance (e.g., good electrical isolation between neighboring photodetectors, good full well capacity, etc.). Accordingly, the image sensor of the present disclosure may have more scaled down dimensions than the typical CIS while also having performance metrics that meet or exceed performance metrics of the typical CIS.

In some embodiments, a process for forming the dielectric filler structure 604 comprises depositing the dielectric filler structure 604 on the dielectric liner structure 602 and depositing the dielectric filler structure 604 to fill the trench 2102. In some embodiments, the dielectric filler structure 604 is also deposited on the back side 102b of the substrate 102. In some embodiments, a planarization process (e.g., CMP) is performed on the dielectric filler structure 604 to planarize an upper surface of the dielectric filler structure 604. In further embodiments, the planarization process (and/or some other removal process) is performed on the dielectric filler structure 604 to remove the portion 702 of the dielectric filler structure 604.

Figure 24:
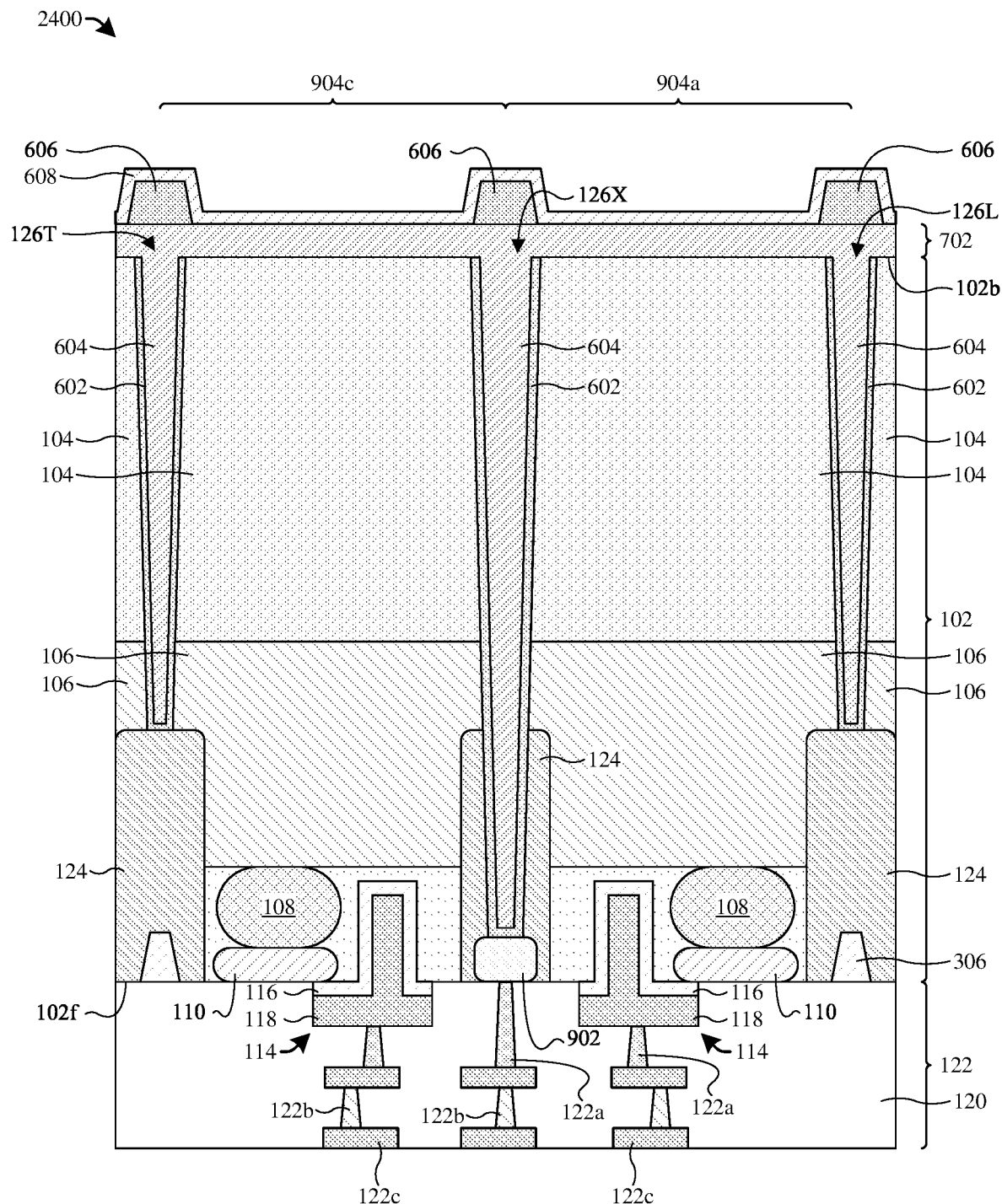

As shown in the cross-sectional view 2400 of FIG. 24, an isolation grid 606 is formed along the portion 702 of the dielectric filler structure 604. In other embodiments, the isolation grid 606 may be formed along the back side 102b of the substrate 102. In further embodiments, the isolation grid 606 is formed overlying the DTI structure 126.

In some embodiments, a process for forming the isolation grid 606 comprises forming a patterned masking layer (not shown), which has a trench disposed therein, on the portion 702 of the dielectric filler structure 604. Thereafter, an isolation material is deposited on the patterned masking layer and in the trench. The isolation material may be or comprise, for example, a metal (e.g., tungsten (W), aluminum (Al), cobalt (Co), copper (Cu), silver (Ag), gold (Au), some other metal, or a combination of the foregoing), an oxide (e.g., SiO2), a nitride (e.g., SiN), a carbide (e.g., SiC), a high-k dielectric material (e.g., HfO, TaO, etc.), a low-k dielectric material, some other isolation material, or a combination of the foregoing. Thereafter, a planarization process is performed (e.g., CMP, etch back process, etc.) on the isolation material to remove an upper portion of the isolation material, thereby leaving lower portions of the isolation material in the trench as the isolation grid 606. Subsequently, in some embodiments, the patterned masking layer is stripped away.

Also shown in the cross-sectional view 2400 of FIG. 24, a dielectric layer 608 is formed along the portion 702 of the dielectric filler structure 604 and over the isolation grid 606. In other embodiments, the dielectric layer 608 may be formed along the back side 102b of the substrate 102 and over the isolation grid 606. In some embodiments, a process for forming the dielectric layer 608 comprises depositing the dielectric layer 608 on the portion 702 of the dielectric filler structure 604 and on the isolation grid 606. The dielectric layer 608 may be deposited by, for example, CVD, PVD, ALD, sputtering, some other deposition process, or a combination of the foregoing.

Figure 25:
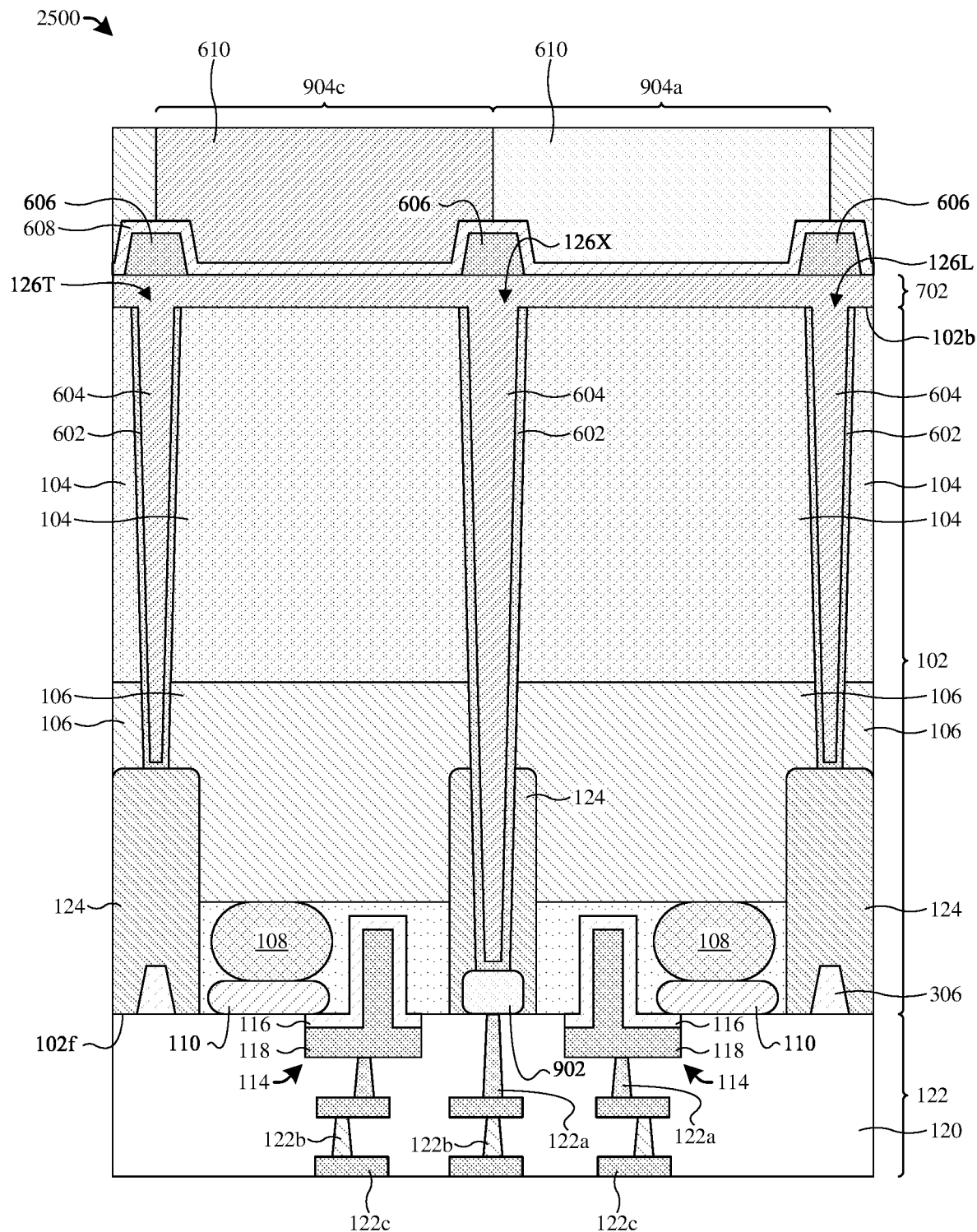

As shown in the cross-sectional view 2500 of FIG. 25, a plurality of EMR filters (see, e.g., EMR filter 610 described herein) are formed on/over the dielectric layer 608 and within the isolation grid 606. In some embodiments, a process for forming the plurality of EMR filters comprises depositing (e.g., via CVD, PVD, ALD, sputtering, a spin-on process, etc.) one or more light filtering materials onto the dielectric layer 608 and within the isolation grid 606. The one or more light filtering materials are materials that allow for the transmission of radiation (e.g., light) having a specific wavelength range, while blocking light of wavelengths outside of the specified range. Subsequently, in some embodiments, a planarization process (e.g., CMP) may be performed on the plurality of EMR filters to planarize the upper surface of the plurality of EMR filters.

Figure 26:
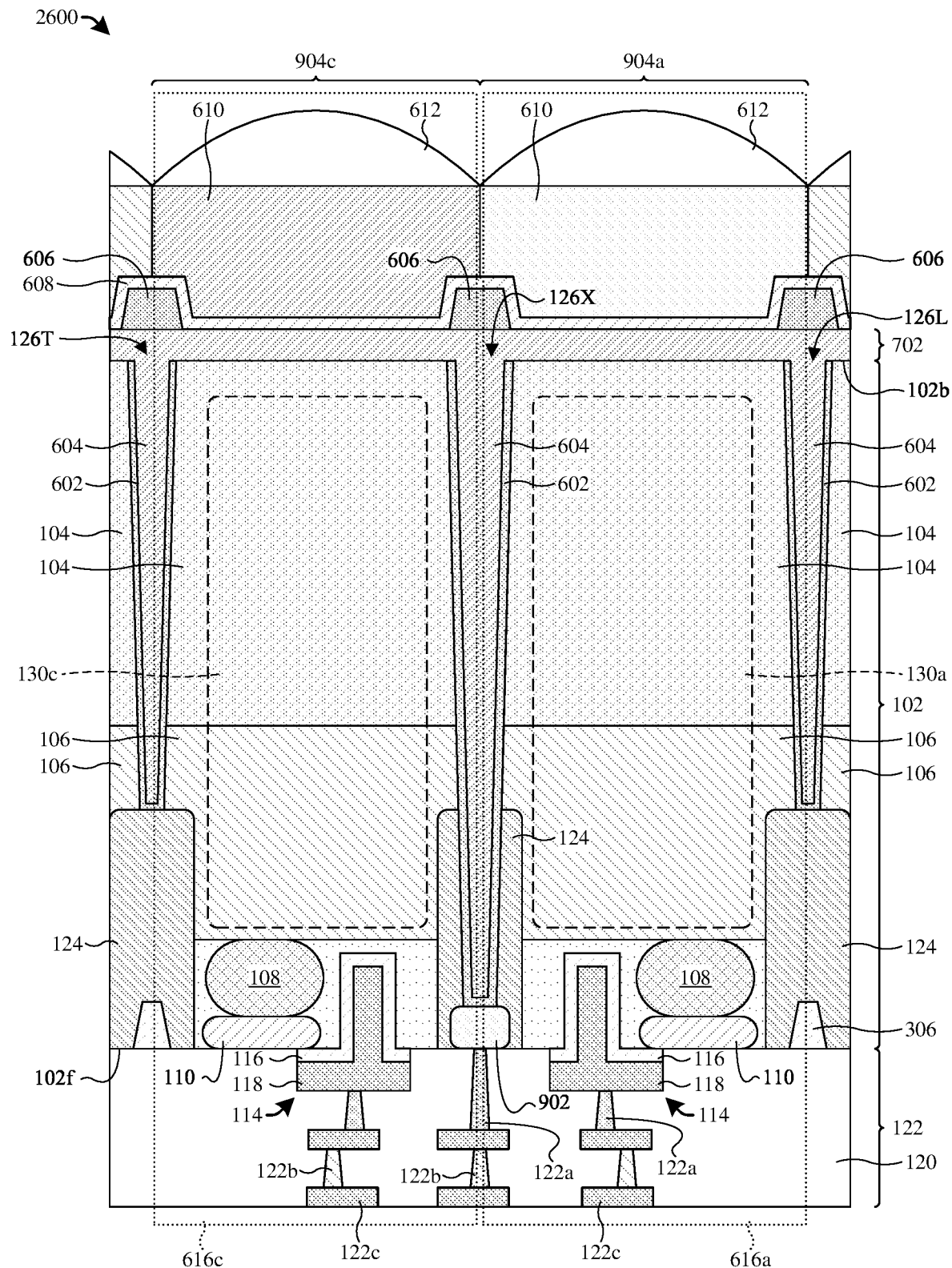

As shown in the cross-sectional view 2600 of FIG. 26, a plurality of micro-lenses (see, e.g., micro-lens 612 described herein) are formed on/over the plurality of EMR filters. In some embodiments, the plurality of micro-lenses may be formed by depositing a micro-lens material on the plurality of EMR filters (e.g., via CVD, PVD, ALD, sputtering, a spin-on process, etc.). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The plurality of micro-lenses are then formed by selectively etching the micro-lens material according to the micro-lens template. In some embodiments, after the plurality of micro-lenses are formed, formation of a plurality of pixel sensor units 616a-616d (see, e.g., FIGS. 9A-9D) is complete. In further embodiments, after the plurality of micro-lenses are formed, formation of the image sensor (see, e.g., FIGS. 9A-9D) is complete.

For clarity, it will be appreciated that spatially relative terms (e.g., over, under, upper, lower, etc.) used herein to describe the structures illustrated in the figures are generally based on the orientation of such structures as illustrated in their respective figures. For example, in describing the structure illustrated in FIG. 26, it may be said that plurality of micro-lenses are formed over the plurality of EMR filters. On the other hand, in describing the structure illustrated in FIG. 9B, it may be said that the plurality of EMR filters overlie the plurality of micro-lenses.

Figure 27:
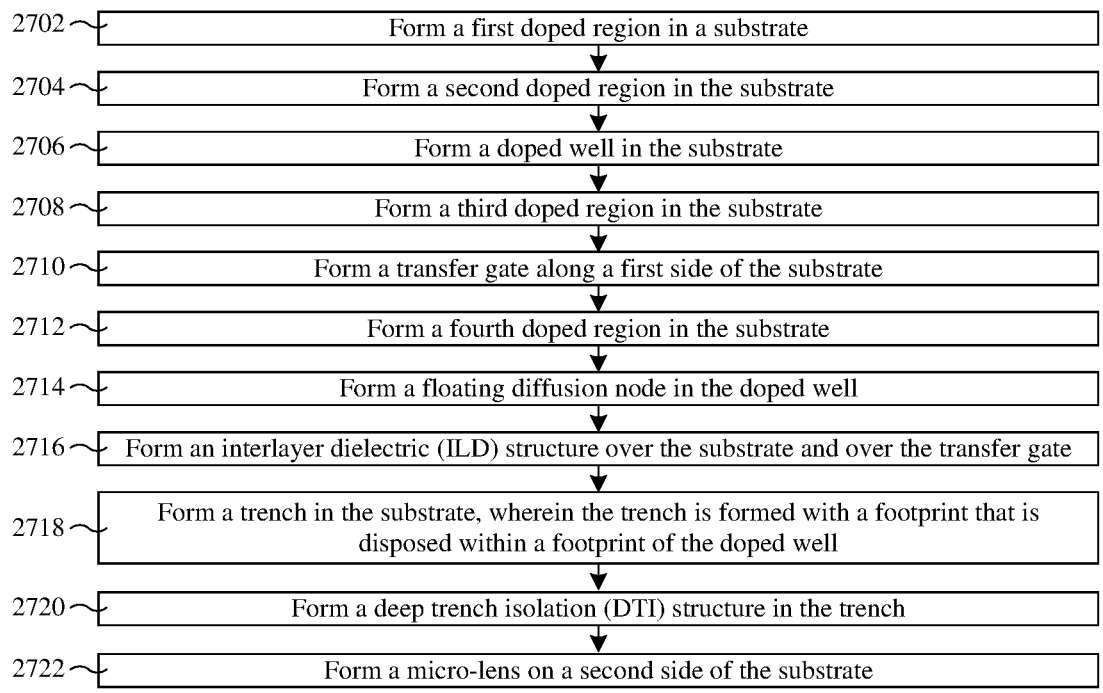
FIG. 27 illustrates a flowchart of some embodiments of a method for forming an image sensor having an improved structure for small pixel designs.

FIG. 27 illustrates a flowchart 2700 of some embodiments of a method for forming an image sensor having an improved structure for small pixel designs. While the flowchart 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2702, a first doped region is formed in a substrate. FIG. 13 illustrates a cross-sectional view 1300 of some embodiments corresponding to act 2702.

At act 2704, a second doped region is formed in the substrate. FIG. 13 illustrates a cross-sectional view 1300 of some embodiments corresponding to act 2704.

At act 2706, a doped well is formed in the substrate. FIG. 14 illustrates a cross-sectional view 1400 of some embodiments corresponding to act 2706.

At act 2708, a third doped region is formed in the substrate. FIGS. 15-16 illustrate a series of cross-sectional views 1500-1600 of some embodiments corresponding to act 2708.

At act 2710, a transfer gate is formed along a first side of the substrate. FIG. 17 illustrates a cross-sectional view 1700 of some embodiments corresponding to act 2710.

At act 2712, a fourth doped region is formed in the substrate. FIG. 18 illustrates a cross-sectional view 1800 of some embodiments corresponding to act 2712.

At act 2714, a floating diffusion node is formed in the doped well. FIG. 19 illustrates a cross-sectional view 1900 of some embodiments corresponding to act 2714.

At act 2716, an interlayer dielectric (ILD) structure is formed over the substrate and over the transfer gate. FIG. 20 illustrates a cross-sectional view 2000 of some embodiments corresponding to act 2716.

At act 2718, a trench is formed in the substrate, wherein the trench is formed with a footprint that is disposed within a footprint of the doped well. FIG. 21 illustrates a cross-sectional view 2100 of some embodiments corresponding to act 2718.

At act 2720, a deep trench isolation (DTI) structure is formed in the trench. FIGS. 22-23 illustrate a series of cross-sectional views 2200-2300 of some embodiments corresponding to act 2720.

At act 2722, a micro-lens is formed on a second side of the substrate. FIGS. 24-26 illustrate a series of cross-sectional views 2400-2600 of some embodiments corresponding to act 2722.

In some embodiments, the present application provides an image sensor. The image sensor comprises a semiconductor substrate, wherein the semiconductor substrate comprises a pixel region, wherein the semiconductor substrate has a first side, and wherein the semiconductor substrate has a second side opposite the first side of the semiconductor substrate. A photodetector is disposed in the pixel region. A first doped region is disposed in the pixel region. A second doped region is disposed in the pixel region, wherein the second doped region is disposed vertically between the first doped region and the first side of the semiconductor substrate. A doped well is disposed in the semiconductor substrate and laterally surrounds the pixel region, wherein the doped well is disposed partially in the second doped region, and wherein a portion of the second doped region is disposed vertically between the doped well and the second side of the semiconductor substrate. A deep trench isolation (DTI) structure is disposed in the semiconductor substrate and laterally surrounding the pixel region, wherein a footprint of the DTI structure is disposed within a footprint of the doped well.

In some embodiments, a portion of the doped well is disposed directly vertically between a portion of the second doped region and the first side of the semiconductor substrate.

In some embodiments, the DTI structure contacts the doped well.

In further embodiments, the DTI structure is disposed at least partially in the doped well.

In some embodiments, the DTI structure is vertically spaced from the doped well.

In further embodiments, a portion of the second doped region is disposed directly vertically between a surface of the DTI structure and the doped well.

In some embodiments, the DTI structure extends vertically through the first doped region and vertically into the second doped region.

In some embodiments, the second doped region extends continuously laterally between opposite inner sides of the doped well and extends continuously laterally between opposite inner sidewalls of the DTI structure.

In some embodiments, the present application provides an image sensor. The image sensor comprises a first photodetector disposed in a first pixel region of a semiconductor substrate, wherein the semiconductor substrate has a first side and a second side opposite the first side. A second photodetector is disposed in a second pixel region of the semiconductor substrate. A first doped region is disposed in both the first pixel region and the second pixel region. A doped well is disposed in the semiconductor substrate and laterally surrounds both the first pixel region and the second pixel region, wherein the doped well is disposed at least partially the first doped region. A floating diffusion node is disposed in the doped well, wherein the floating diffusion node is disposed laterally between the first photodetector and the second photodetector. A deep trench isolation (DTI) structure is disposed in the semiconductor substrate and laterally surrounds both the first pixel region and the second pixel region. A footprint of the DTI structure is disposed within a footprint of the doped well. A first portion of the DTI structure extends laterally through the semiconductor substrate in a first direction. A second portion of the DTI structure extends laterally through the semiconductor substrate in a second direction perpendicular to the first direction. The first portion of the DTI structure intersects the second portion of the DTI structure at a third portion of the DTI structure. The floating diffusion node overlies the third portion of the DTI structure. The first portion of the DTI structure has a first depth. The second portion of the DTI structure has a second depth. The third portion of the DTI structure has a third depth. The third depth is greater than the first depth. The third depth is greater than the second depth.

In some embodiments, the first depth is substantially the same as the second depth.

In some embodiments, the third portion of the DTI structure extends vertically into the doped well, and the first portion of the DTI structure and the second portion of the DTI structure are vertically spaced from the doped well.

In some embodiments, the third portion of the DTI structure extends vertically into the doped well; the first portion of the DTI structure extends vertically into the doped well; and the second portion of the DTI structure extends vertically into the doped well.

In some embodiments, a shallow trench isolation (STI) structure is disposed in the semiconductor substrate and in the doped well, wherein the STI structure has a first portion overlying the first portion of the DTI structure, wherein the STI structure has a second portion overlying the second portion of the DTI structure, and wherein a lower surface of the first portion of the STI structure is disposed vertically between an upper surface of the third portion of the DTI structure and an upper surface of the first portion of the DTI structure.

In some embodiments, a transfer gate is disposed along the first side of the semiconductor substrate, wherein the transfer gate has a lower portion that extends vertically into the first pixel region from the first side of the semiconductor substrate, and wherein a lower surface of the lower portion of the transfer gate is disposed vertically between an upper surface of the third portion of the DTI structure and an upper surface of the first portion of the DTI structure.

In further embodiments, the lower surface of the lower portion of the transfer gate is substantially aligned with an upper side of the first doped region.

In some embodiments, a second doped region is disposed in the first pixel region, wherein the second doped region is disposed vertically between the first doped region and the first side of the semiconductor substrate, and wherein a portion of the second doped region is disposed vertically between an upper surface of the third portion of the DTI structure and an upper surface of the first portion of the DTI structure.

In some embodiments, a first portion of the first doped region is disposed in the first pixel region and contacts the third portion of the DTI structure; a second portion of the first doped region is disposed in the second pixel region and contacts the third portion of the DTI structure; the first portion of the first doped region has a first doping concentration of first doping type dopants; the second portion of the first doped region has a second doping concentration of the first doping type dopants; and the first doping concentration is at least ninety percent (90%) of the second doping concentration.

In further embodiments, the doped well overlies both the first portion of the first doped region and the second portion of the first doped region.

In some embodiments, the present application provides a method for forming an image sensor. The method comprises forming a doped region in a semiconductor substrate, wherein the doped region is formed via a blanket doping process. A doped well is formed in the semiconductor substrate, wherein the doped well is formed extending into the semiconductor substrate from a first side of the semiconductor substrate and formed vertically spaced from a second side of the semiconductor substrate, wherein the first side of the semiconductor substrate is opposite the second side of the semiconductor substrate, and wherein the doped well extends vertically into the doped region. A transfer gate is formed along the first side of the semiconductor substrate, wherein the transfer gate is formed laterally between a first portion of the doped well and a second portion of the doped well. A floating diffusion node is formed in the first portion of the doped well. A deep trench isolation (DTI) structure is formed in the semiconductor substrate, wherein the DTI structure extends into the semiconductor substrate from the second side of the semiconductor substrate, wherein the DTI structure is formed with a footprint that is disposed within a footprint of the doped well, and wherein forming the DTI structure comprises forming a trench in the semiconductor substrate that exposes a portion of the doped region.

In some embodiments, the trench comprises a transverse portion, a longitudinal portion, and an intersection portion. The intersection portion of the trench corresponds to a portion of the trench in which the transverse portion of the trench intersects the longitudinal portion of the trench. The intersection portion of the trench extends deeper into the semiconductor substrate than both the transverse portion of the trench and the longitudinal portion of the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
    forming a doped region in a semiconductor substrate, wherein the doped region is formed via a blanket doping process;
    forming a doped well in the semiconductor substrate, wherein the doped well is formed extending into the semiconductor substrate from a first side of the semiconductor substrate and formed vertically spaced from a second side of the semiconductor substrate, wherein the first side of the semiconductor substrate is opposite the second side of the semiconductor substrate, and wherein the doped well extends vertically into the doped region;
    forming a transfer gate along the first side of the semiconductor substrate, wherein the transfer gate is formed laterally between a first portion of the doped well and a second portion of the doped well;
    forming a floating diffusion node in the first portion of the doped well;
    forming a deep trench isolation (DTI) structure in the semiconductor substrate, wherein the DTI structure extends into the semiconductor substrate from the second side of the semiconductor substrate, wherein the DTI structure is formed with a footprint that is disposed within a footprint of the doped well, and wherein forming the DTI structure comprises forming a trench in the semiconductor substrate that exposes a portion of the doped region; and
    wherein the trench comprises a transverse portion, a longitudinal portion, and an intersection portion, wherein the intersection portion of the trench corresponds to a portion of the trench in which the transverse portion of the trench intersects the longitudinal portion of the trench, and wherein the intersection portion of the trench extends deeper into the semiconductor substrate than both the transverse portion of the trench and the longitudinal portion of the trench.

2. The method of claim 1, wherein the doped region is vertically separated from the floating diffusion node by a non-zero distance.

3. The method of claim 1, wherein the doped well vertically extends past a lower boundary of the floating diffusion node that faces the doped region.

4. The method of claim 1, further comprising:
forming a second doped region within the semiconductor substrate, wherein the second doped region is vertically between the doped region and the first side of the semiconductor substrate;
forming a third doped region within the semiconductor substrate, wherein the third doped region is vertically between the second doped region and the first side of the semiconductor substrate; and
wherein the second doped region and the third doped region are laterally between the transfer gate and the second portion of the doped well.

5. The method of claim 1, further comprising:
forming a shallow trench isolation (STI) structure within the doped well, wherein the doped well extends along sides and a lower surface of the STI structure.

6. The method of claim 5, wherein the doped well is vertically and directly between the DTI structure and the STI structure.

7. The method of claim 1,
wherein a first part of the doped region that is arranged along a first sidewall of the DTI structure and directly below the first portion of the doped well has a first doping concentration; and
wherein a second part of the doped region that is arranged along a second sidewall of the DTI structure and directly below the first portion of the doped well has a second doping concentration that is different than the first doping concentration.

8. A method of forming an integrated chip, comprising:
implanting a first plurality of dopants into a semiconductor substrate to form a doped region within the semiconductor substrate;
implanting a second plurality of dopants into the semiconductor substrate to form a doped well extending from a first side of the semiconductor substrate to within the doped region;
forming a transfer gate along the first side of the semiconductor substrate, wherein the transfer gate is laterally surrounded by the doped well;
etching a second side of the semiconductor substrate, which opposes the first side, to form one or more first trenches extending into the semiconductor substrate and into a portion of the doped region;
forming one or more first dielectric materials within the one or more first trenches;
etching the first side of the semiconductor substrate to form one or more second trenches within the doped well, wherein the doped well extends along sides and a lower surface of the semiconductor substrate forming the one or more second trenches; and
forming one or more second dielectric materials within the one or more second trenches.

9. The method of claim 8, wherein the doped well has a larger height than the one or more second trenches.

10. The method of claim 8, wherein the doped region has a first doping type and the doped well has a second doping type that is different than the first doping type.

11. The method of claim 8, wherein a part of the doped region that is vertically between a bottom of the doped well and a bottom of the doped region has a gradient doping profile that changes along a lateral direction.

12. The method of claim 11, wherein the gradient doping profile comprises two or more distinct doping concentrations that are within 6% of each other.

13. The method of claim 8, further comprising:
forming a second doped region within the semiconductor substrate, the second doped region being vertically between the doped region and the second side of the semiconductor substrate; and
wherein the one or more first trenches vertically extend through the second doped region and into the doped region.

14. The method of claim 13, wherein the one or more first trenches expose a part of the doped well.

15. A method of forming an integrated chip, comprising:
forming a doped region within a substrate;
forming a doped well extending from a first side of the substrate to the doped region, wherein the doped well laterally surrounds a pixel region of the substrate and wherein the doped well has discrete segments with outermost edges that face one another and that are separated by a non-zero distance along the first side in a cross-sectional view;
forming a transfer gate along the first side of the substrate within the pixel region;
forming one or more trenches extending from a second side of the substrate, which opposes the first side, to the doped well, wherein the one or more trenches laterally surround the pixel region of the substrate;
forming one or more dielectric materials within the one or more trenches; and
forming a second doped region within the substrate, wherein the second doped region is vertically between the doped region and the first side of the substrate and laterally between the transfer gate and the doped well.

16. The method of claim 15, further comprising:
forming one or more interconnects within a dielectric structure disposed along the first side of the substrate.

17. The method of claim 15, wherein the one or more dielectric materials include a dielectric liner structure contacting the doped well and a dielectric filler structure separated from the doped well by the dielectric liner structure.

18. The method of claim 15, wherein the transfer gate vertically extends to the doped region, the doped well extending below a bottom of the transfer gate.

19. The method of claim 15, further comprising:
forming a third doped region within the substrate, wherein the third doped region is vertically between the second doped region and the first side of the substrate and laterally between the transfer gate and the doped well.

20. The method of claim 15,
wherein the doped region is formed by implanting dopants having a first doping type into the substrate; and
wherein the doped well is formed by implanting dopants having a second doping type into the substrate, the second doping type being different than the first doping type.

* * * * *